(12) United States Patent
Liu et al.

(10) Patent No.: US 12,041,406 B2
(45) Date of Patent: Jul. 16, 2024

(54) WIRELESS HEADSET AND HEADSET BOX

(71) Applicant: Huawei Technologies Co., Ltd., Shenzhen (CN)

(72) Inventors: Qingqiu Liu, Shenzhen (CN); Baoxia Li, Dongguan (CN); Lin Lu, Shanghai (CN); Guofei Diao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 294 days.

(21) Appl. No.: 17/605,821

(22) PCT Filed: Apr. 17, 2020

(86) PCT No.: PCT/CN2020/085287
§ 371 (c)(1),
(2) Date: Oct. 22, 2021

(87) PCT Pub. No.: WO2020/216141
PCT Pub. Date: Oct. 29, 2020

(65) Prior Publication Data
US 2022/0210535 A1 Jun. 30, 2022

(30) Foreign Application Priority Data

Apr. 25, 2019 (CN) .......................... 201910340845.8

(51) Int. Cl.
*H04R 1/10* (2006.01)
*H02J 7/00* (2006.01)
*H05K 1/14* (2006.01)

(52) U.S. Cl.
CPC .......... *H04R 1/1025* (2013.01); *H02J 7/0029* (2013.01); *H02J 7/0042* (2013.01);
(Continued)

(58) Field of Classification Search
CPC .. H04R 1/1025; H04R 1/1016; H04R 1/1041; H04R 1/1058; H04R 2420/07;
(Continued)

(56) References Cited

U.S. PATENT DOCUMENTS 9,769,558 B2 * 9/2017 Chandramohan .... A45C 13/005
2008/0164770 A1 * 7/2008 Terlizzi .................. H04R 5/033
455/73

(Continued)

FOREIGN PATENT DOCUMENTS

CN 201130959 Y 10/2008
CN 201478543 U 5/2010
(Continued)

*Primary Examiner* — Akelaw Teshale
(74) *Attorney, Agent, or Firm* — Conley Rose, P.C.

(57) ABSTRACT

A wireless headset includes a housing and a power system disposed in a cavity enclosed by the housing and configured to supply power to the wireless headset. The wireless headset further includes a first electrical connector and a second electrical connector disposed on the housing of the wireless headset and are respectively electrically connected to two electrodes of the power system. The housing includes a rod body and an earbud connected to a top of the rod body, wherein the first electrical connector is located at a bottom end of the rod body, and the second electrical connector is located on an outer side wall of the earbud.

20 Claims, 18 Drawing Sheets

(52) U.S. Cl.
CPC ......... *H04R 1/1016* (2013.01); *H04R 1/1041* (2013.01); *H04R 1/1058* (2013.01); *H05K 1/148* (2013.01); *H04R 2420/07* (2013.01); *H05K 2201/1025* (2013.01)

(58) Field of Classification Search
CPC .. H04R 25/55; H04R 25/556; H04R 2225/31; H04R 2460/17; H04R 1/1033; H04R 2201/10; H04R 5/033; H04R 1/10; H04R 1/1008; H04R 5/0335; H04R 2420/09; H02J 7/0029; H02J 7/0042; H05K 1/148; H05K 2201/1025
See application file for complete search history.

(56) References Cited

U.S. PATENT DOCUMENTS

| | | | | |
|---|---|---|---|---|
| 2011/0286615 | A1 | 11/2011 | Olodort et al. | |
| 2014/0226836 | A1* | 8/2014 | Miyatake | H04R 1/1083 381/94.1 |
| 2015/0115871 | A1* | 4/2015 | Feril | H04R 1/1058 320/103 |
| 2017/0094381 | A1* | 3/2017 | LeBlanc | A45C 13/005 |
| 2017/0094391 | A1* | 3/2017 | Panecki | A45C 13/005 |
| 2017/0094392 | A1* | 3/2017 | Zörkendörfer | H04R 1/2826 |
| 2017/0094394 | A1* | 3/2017 | McPeak | A45C 11/24 |
| 2017/0094395 | A1* | 3/2017 | McPeak | H04B 5/79 |
| 2017/0094397 | A1* | 3/2017 | Wagman | A45C 11/00 |
| 2017/0094399 | A1* | 3/2017 | Chandramohan | H04R 5/033 |
| 2017/0238087 | A1* | 8/2017 | Chawan | H04R 1/1016 381/380 |
| 2017/0347182 | A1* | 11/2017 | Chawan | B65D 25/02 |
| 2019/0090045 | A1 | 3/2019 | Hankey et al. | |
| 2019/0289382 | A1* | 9/2019 | Chawan | H04R 5/033 |

FOREIGN PATENT DOCUMENTS

| | | |
|---|---|---|
| CN | 204090096 U | 1/2015 |
| CN | 106559720 A | 4/2017 |
| CN | 208158837 U | 11/2018 |
| CN | 109120047 A | 1/2019 |
| CN | 208434085 U | 1/2019 |
| CN | 109547884 A | 3/2019 |
| CN | 109547889 A | 3/2019 |
| CN | 208638551 U | 3/2019 |
| CN | 110166866 A | 8/2019 |
| TW | M557928 U | 4/2018 |

* cited by examiner

WIRELESS HEADSET AND HEADSET BOX

CROSS-REFERENCE TO RELATED APPLICATIONS

This is a U.S. National Stage of International Patent Application No. PCT/CN2020/085287 filed on Apr. 17, 2020, which claims priority to Chinese Patent Application No. 201910340845.8 filed on Apr. 25, 2019. The disclosures of the aforementioned applications are hereby incorporated by reference in their entireties.

TECHNICAL FIELD

Embodiments of this application relate to the field of electronic technologies, and in particular, to a wireless headset and a headset box.

BACKGROUND

As users impose a higher requirement for portability, a wireless headset becomes popular with more users. Usually, the wireless headset is used in cooperation with a headset box. The headset box may house the wireless headset and charge the wireless headset.

Corresponding electrical connectors may be respectively disposed on the wireless headset and in the headset box, and the electrical connector is configured to conduct and transmit a current. When the wireless headset is housed in the headset box and the electrical connector on the wireless headset is in contact with the electrical connector in the headset box, the wireless headset may be charged through a current transmission function of the electrical connector.

With development of an electronics technology, the wireless headset has more functions and includes more components. For example, the wireless headset may include a plurality of components such as an electrical connector, a battery, a wireless module, a processor, a memory, a speaker, and a microphone. However, to meet a requirement of the user for convenience and lightness, the wireless headset has a relatively small size. Consequently, there is relatively great difficulty in a circuit design of the components such as the electrical connector inside the wireless headset.

SUMMARY

Embodiments of this application provide a wireless headset. Two electrical connectors on the wireless headset are dispersedly disposed, to reduce difficulty in a circuit design, and beautify an appearance of the wireless headset.

To achieve the foregoing object, the following technical solutions are used in the embodiments of this application:

According to an aspect, an embodiment of this application provides a wireless headset, including a housing and a power module disposed in a cavity enclosed by the housing, where the power module is configured to supply power to the wireless headset; the wireless headset further includes a first electrical connector and a second electrical connector, the first electrical connector and the second electrical connector are disposed on the housing of the wireless headset and are respectively electrically connected to two electrodes of the power module, and the electrode includes a positive electrode or a negative electrode; the housing includes a rod body and an earbud connected to a top of the rod body, the first electrical connector is located at a bottom end of the rod body, and the second electrical connector is located on an outer side wall of the earbud; and the first electrical connector and the second electrical connector are configured to transmit a current from a headset box to the power module when the first electrical connector and the second electrical connector are respectively in contact with a third electrical connector and a fourth electrical connector in the headset box, to charge the power module.

In this solution, that first electrical connector is located at the bottom end of the rod body, and the second electrical connector is located on an outer side wall that is of the earbud and that is relatively far away from the bottom end of the rod body. In other words, the first electrical connector and the second electrical connector are dispersedly disposed on the wireless headset, and there may be more plenty of space inside the wireless headset to dispose each electrical connector and another component that is used in cooperation with the electrical connector, to reduce difficulty in a circuit design. In addition, there is only one first electrical connector at the bottom end of the rod body, and the bottom end of the rod body is more beautiful.

In a possible design, the second electrical connector is located on a location that is on the outer side wall of the earbud and that is opposite to a side that is of the rod body and that extends towards the bottom end.

In this case, the second electrical connector is easily blocked by the rod body and the earbud and cannot be seen. Therefore, the wireless headset looks more simple and beautiful.

In another possible design, the first electrical connector and the second electrical connector are a pogo pin interface, a spring pin, a spring plate, a conducting block, a conductive patch, a conductive sheet, a pin, a plug, a contact pad, a jack, or a socket.

In other words, the first electrical connector and the second electrical connector may specifically have various structures, types, and forms.

In another possible design, the power module includes a power management unit and a battery, and the power management unit includes a power management integrated circuit (integrated circuit, IC), a protection IC, and an electricity meter IC; the first electrical connector and the second electrical connector are respectively electrically connected to two electrodes of an input end of the power management unit; two electrodes of an output end of the power management unit are respectively electrically connected to two electrodes of the battery; and the first electrical connector and the second electrical connector are configured to: when the first electrical connector and the second electrical connector are respectively in contact with the third electrical connector and the fourth electrical connector in the headset box, transmit the current from the headset box to the power management unit, and transmit the current to the battery through the power management unit, to charge the battery.

In this case, an electric signal input by the electric connector from the headset box is processed by the power management unit in the power module, and then is transmitted to the battery for charging.

In another possible design, the cavity includes a first printed circuit board, a second printed circuit board disposed at a bottom of the rod body, and a flexible board that connects the first printed circuit board and the second printed circuit board; the power management unit is disposed on the first printed circuit board, and a negative electrode of the power management unit is grounded; a positive electrode of the battery is electrically connected to a positive electrode of the power management unit on the first printed circuit board through the flexible board; a negative electrode of the battery is grounded through the flexible board, to be electrically connected to the negative electrode of the power management unit the first electrical connector is disposed on the second printed circuit board, and the first electrical connector is grounded to be electrically connected to the negative electrode of the power management unit and the second electrical connector is disposed on the flexible board, and the second electrical connector is electrically connected to the positive electrode of the power management unit on the first printed circuit board through the flexible board.

In this solution, the battery may be electrically connected to a power management unit on a rigid board through the flexible board. The first electrical connector may be disposed on one rigid board and grounded. The second electrical connector may be disposed on the flexible board, and is electrically connected, through the flexible board, to a positive electrode of a power management power unit disposed on another rigid board. A negative electrode of the power management unit is grounded, to be electrically connected to the first electrical connector.

In another possible design, the first electrical connector includes a snap-on component and a soldered component, and the snap-on component and the soldered component are respectively a first step and a second step that are of the first electrical connector and that extend inwards; the second printed circuit board is provided with a snap-on groove and a snap-on groove shaped pad; and the snap-on component and the soldered component respectively cooperate with the snap-on groove and the snap-on groove shaped pad, so that the first electrical connector is disposed at the bottom end of the rod body and is electrically connected to the second printed circuit board.

In this possible design, a specific disposing solution of the first electrical connector at a rod end is provided.

In another possible design, the second electrical connector is a conductive patch soldered to the flexible board; and the outer side wall of the earbud is provided with an opening, a part of the conductive patch is exposed from the opening, an adhesive is attached to a location at which the second electrical connector is in contact with the outer side wall of the earbud, and the adhesive is used to fasten the second electrical connector to the outer side wall of the earbud.

In this possible design, a specific disposing solution of the first electrical connector located on the outer side wall of the earbud is provided.

In another possible design, the second electrical connector is electrically connected to a positive electrode of an input end of the power management integrated circuit IC in the power management unit on the first printed circuit board through the flexible board; a positive electrode of an output end of the power management integrated circuit IC is electrically connected to a positive electrode of the protection IC and the positive electrode of the battery through the electricity meter IC; a negative electrode of the power management integrated circuit IC and a negative electrode of the protection IC are grounded; and the first electrical connector and the second electrical connector are configured to: when the first electrical connector and the second electrical connector are respectively in contact with the third electrical connector and the fourth electrical connector in the headset box, transmit the current from the headset box to the power management integrated circuit IC, and transmit the current to the electricity meter IC through the power management integrated circuit IC, and transmit the current to the battery and the protection IC after the current passes through the electricity meter IC, to charge the battery and perform circuit protection through the protection IC.

In this possible design, a specific connection manner inside the power management unit is provided.

In a possible design, a distance between the first electrical connector and the second electrical connector is greater than or equal to a preset value.

In this solution, the distance between the first electrical connector and the second electrical connector is greater than or equal to the preset value. In other words, the first electrical connector and the second electrical connector are dispersedly disposed on the wireless headset, and there may be more plenty of space inside the wireless headset to dispose each electrical connector and another component that is used in cooperation with the electrical connector, to reduce difficulty in a circuit design.

In another possible design, the housing includes a rod body and an earbud connected to a top of the rod body, the first electrical connector is located at a bottom end of the rod body, and the second electrical connector is located on an outer side wall of the rod body.

In other words, the first electrical connector and the second electrical connector may be separately disposed on different parts of the rod body (to be specific, the bottom end of the rod body and the outer side wall of the rod body), and the distance between the first electrical connector and the second electrical connector is greater than the preset value.

In another possible design, the first electrical connector is located at the bottom end of the rod body, and the second electrical connector is located on the outer side wall of the rod body and on the end that is far away from the bottom of the rod body.

When the second electrical connector is located on the outer side wall of the rod body and on the end that is far away from the bottom of the rod body, the distance between the second electrical connector and the first electrical connector at the bottom end of the rod body is relatively long, and there may be more plenty of space inside the wireless headset to dispose each electrical connector and another component that is used in cooperation with the electrical connector, to reduce difficulty in a circuit design.

In another possible design, the housing includes the rod body and the earbud connected to the top of the rod body, and the first electrical connector and the second electrical connector are located on the outer side wall of the rod body.

In other words, both the first electrical connector and the second electrical connector may be disposed on a same component, to be specific, the outer side wall of the rod body, and the distance between the first electrical connector and the second electrical connector is greater than the preset value.

In another possible design, the first electrical connector is located on the outer side wall of the rod body and on an end that is close to the bottom of the rod body, and the second electrical connector is located on the outer side wall of the rod body and on the end that is far away from the bottom of the rod body.

In this case, the distance between the two electrical connectors is relatively long, and there may be more plenty of space inside the wireless headset to dispose each electrical connector and another component that is used in cooperation with the electrical connector, to reduce difficulty in a circuit design.

In another possible design, the housing includes the rod body and the earbud connected to the top of the rod body, the first electrical connector is located on the outer side wall of the rod body, and the second electrical connector is located on the outer side wall of the earbud.

In other words, the first electrical connector and the second electrical connector may be separately disposed on outer side walls of different components, to be specific, the outer side wall of the rod body and the outer side wall of the earbud, and the distance between the first electrical connector and the second electrical connector is greater than the preset value.

In another possible design, the first electrical connector is located on the end that is close to the bottom of the rod body, and the second electrical connector is located on the outer side wall of the earbud.

In this case, the distance between the two electrical connectors is relatively long, and there may be more plenty of space inside the wireless headset to dispose each electrical connector and another component that is used in cooperation with the electrical connector, to reduce difficulty in a circuit design.

In another possible design, the housing includes the earbud, and the first electrical connector and the second electrical connector are located on the outer side wall of the earbud.

In other words, both the first electrical connector and the second electrical connector may be disposed on a same component, to be specific, the outer side wall of the earbud, and the distance between the first electrical connector and the second electrical connector is greater than the preset value.

In another possible design, the first electrical connector is located on the outer side wall of the earbud and on the end that is close to the top of the earbud, and the second electrical connector is located on the outer side wall of the earbud and on the end that is close to the bottom of the earbud.

In this case, the distance between the two electrical connectors is relatively long, and there may be more plenty of space inside the wireless headset to dispose each electrical connector and another component that is used in cooperation with the electrical connector, to reduce difficulty in a circuit design.

In another possible design, the first electrical connector is of a plastic material, and an outer surface is plated with a conductive material.

In this way, the first electrical connector may have a lighter weight, and the wireless headset is lighter.

In another possible design, the outer surface of the first electrical connector and an outer surface of the second electrical connector are plated with an anti-corrosion metal.

Therefore, the electrical connector can be prevented from being corroded, and a service life of the electrical connector and a service life of the wireless headset can he increased.

In another possible design, the wireless headset further includes at least one memory, configured to store program code; at least one processor, configured to execute the program code in the memory, to implement a function of the wireless headset; a wireless communications module, configured to perform communication with another device; and an audio module, configured to input or output an audio signal.

In other words, the wireless headset may further have a plurality of other components, to implement a plurality of functions such as wireless communication, audio processing, control, and storage.

According to another aspect, an embodiment of this application provides a wireless headset, including a housing and a power module disposed in a cavity enclosed by the housing, where the power module is configured to supply power to the wireless headset; the wireless headset further includes a first electrical connector and a second electrical connector, the first electrical connector and the second electrical connector are disposed on the housing of the wireless headset and are respectively electrically connected to two electrodes of the power module, and the electrode includes a positive electrode or a negative electrode; the housing includes a rod body and an earbud connected to atop of the rod body, the first electrical connector is located at a bottom end of the rod body, and the second electrical connector is located on an outer side wall of the earbud; and the first electrical connector and the second electrical connector are configured to transmit a current from a headset box to the power module when the first electrical connector and the second electrical connector are respectively in contact with a third electrical connector and a fourth electrical connector in the headset box, to charge the power module.

Therefore, a distance between the first electrical connector and the second electrical connector is relatively long. The first electrical connector and the second electrical connector may be dispersedly disposed, and there may be more plenty of space inside the wireless headset to dispose each electrical connector and another component that is used in cooperation with the electrical connector, to reduce difficulty in a circuit design. In addition, there is only one first electrical connector at the bottom end of the rod body, and the bottom end of the rod body is more beautiful.

According to another aspect, an embodiment of this application provides a headset box, including a power module and a cavity for accommodating a wireless headset. An inner wall of the cavity is provided with a third electrical connector and a fourth electrical connector that respectively correspond to a first electrical connector and a second electrical connector of the wireless headset, and the third electrical connector and the fourth electrical connector are respectively connected to two electrodes of the power module. The electrode includes a positive electrode or a negative electrode. The third electrical connector and the fourth electrical connector are configured to transmit a current from the power module to the wireless headset when the third electrical connector and the fourth electrical connector are respectively in contact with the first electrical connector of the wireless headset and the second electrical connector of the wireless headset, to charge the wireless headset.

In this solution, there is also a relatively long distance between the third electrical connector and the fourth electrical connector that cooperate with the first electrical connector and the second electrical connector whose distance is greater than a preset value. The headset box may charge a battery in the wireless headset after the third electrical connector and the fourth electrical connector are separately in contact with the first electrical connector and the second electrical connector.

According to another aspect, an embodiment of this application provides a system, including the wireless headset and the headset box in any one of the foregoing possible designs. When the wireless headset is housed in the headset box, and the first electrical connector and the second electrical connector on the wireless headset are respectively in contact with the third electrical connector and the fourth electrical connector in the headset box, the headset box charges the wireless headset.

According to another aspect, an embodiment of this application provides a system, including the wireless headset and a mobile phone in any one of the foregoing possible designs. The wireless headset performs wireless communication with the mobile phone, to process an audio service such as music or a call of the mobile phone.

DESCRIPTION OF EMBODIMENTS

The following describes technical solutions in the embodiments of this application with reference to the accompanying drawings in the embodiments of this application. It is clear that the described embodiments are merely some rather than all of the embodiments of this application.

The following terms such as "first" and "second" are merely intended for a purpose of description, and shall not be understood as an indication or implication of relative importance or implicit indication of the quantity of indicated technical features. Therefore, a feature limited by "first" or "second" may explicitly or implicitly include one or more features.

In the descriptions of this application, it should be understood that orientation or location relationships indicated by terms such as "center", "upper", "lower", "front", "rear", "left", "right", "vertical", "horizontal", "top", "bottom", "inside", "outside", "upright", and "lateral" are orientation or location relationships as shown in the accompanying drawings, and these terms are just used to facilitate description of this application and simplify the description, but not to indicate or imply that the mentioned apparatus or elements need to have a specific orientation and need to be constructed and operated in a specific orientation, and therefore, these terms cannot be understood as a limitation to this application.

In the descriptions of this application, it should be noted that, terms "disposing", "connecting", and "connection" should be understood in a broad sense unless otherwise expressly specified and limited. For example, "connection" may be a fixed connection, a detachable connection, or an integrated connection. For a person of ordinary still in the art, a specific meaning of the foregoing terms in this application may be understood according to a specific situation.

A wireless headset may be used in cooperation with an electronic device such as a mobile phone, a notebook computer, or a watch, to process an audio service such as a media service or a call service of the electronic device and some other data services. For example, the audio service may include a media service such as playing music, recording, a sound in a video file, background music in a game, or a ringtone for a user; and may further include playing voice data of a peer end for the user, or collecting voice data of the user and sending the voice data to a peer end, in a call service scenario such as a call, a WeChat voice message, an audio call, a video call, a game, a voice assistant.

Figure 1:
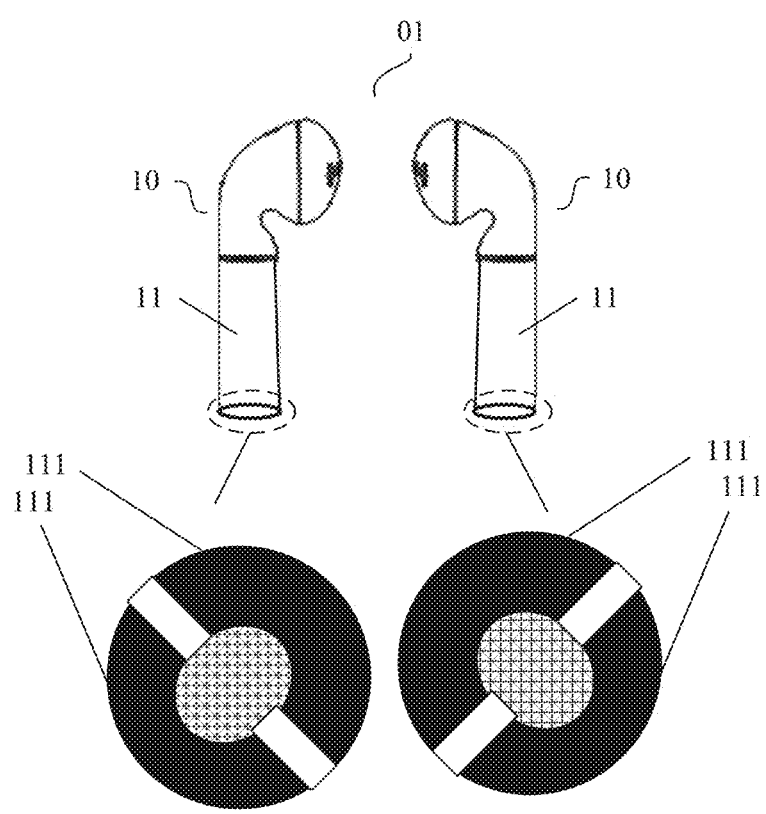
FIG. 1 is a schematic diagram of a wireless headset provided in the conventional technology.

In the conventional technology, as shown in FIG. 1, a wireless headset 01 includes two headset bodies 10, and the headset body 10 may include a rod body 11 and an earbud connected to a top of the rod body 11. A bottom end of the rod body 11 is provided with two electrical connectors 111. When the electrical connector is in contact with an electrical connector in a headset box, a current may he transmitted, to charge the headset body through the headset box. Because there is limited space at a bottom of the rod body, there is also limited space on a circuit board at the bottom of the rod body. In consideration of a case in which there may he an installation error of a component, a specified distance needs to be reserved between different components on the circuit board. In addition, in consideration of impact of mutual coupling between signals, or the like, there needs to be a specified distance between different signal cables on the circuit board. Consequently, there is relatively limited space near the electrical connector at the bottom of the rod body.

Figure 2A:
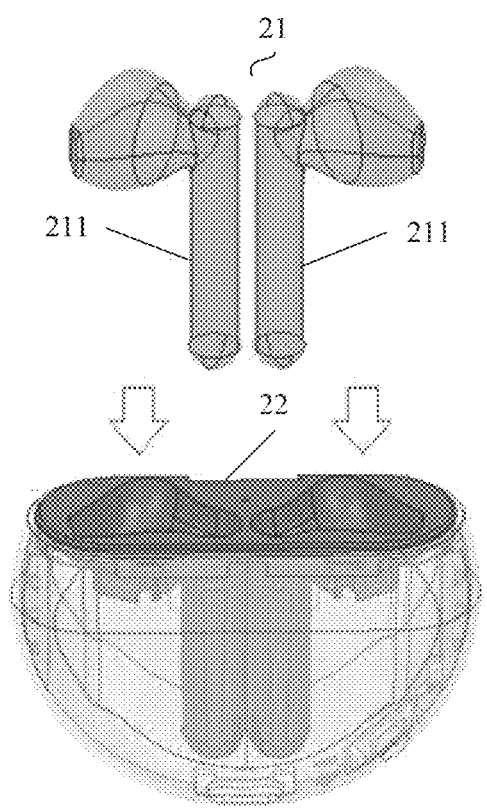
FIG. 2(a) and FIG. 2(b) are a schematic diagram of two groups of wireless headsets and headset boxes according to an embodiment of this application.
Figure 2B:
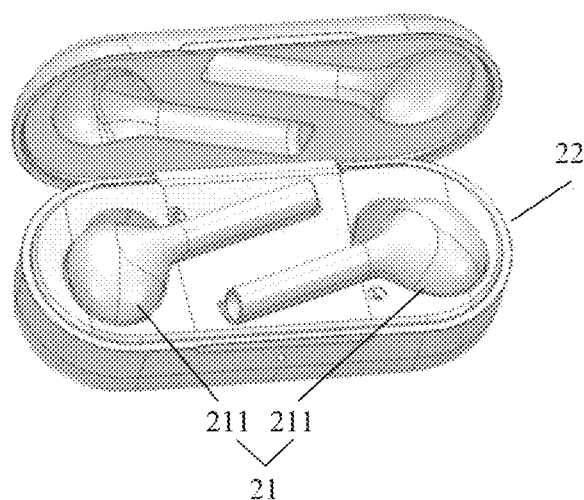

Referring to FIG. 2(a) and FIG. 2(b), an embodiment of this application provides a wireless headset 21. The wireless headset 21 may include a pair of headset bodies 211 that is used in cooperation with the left ear and the right ear of a user. The headset body may be specifically an earbud-type headset, an ear-hanging-type headset, an in-ear-type headset, or the like. For example, the wireless headset may he a true wireless stereo (true wireless stereo, TWS) headset.

Each headset body may include two electrical connectors (or referred to as contacts), and the two electrical connectors are respectively electrically connected to two electrodes (to be specific, a positive electrode and a negative electrode, or referred to as an anode and a cathode) of a system power supply in the headset body. In addition, the two electrical connectors are dispersedly disposed on the headset body. Herein, that the two electrical connectors are dispersedly disposed on the headset body means that a distance between the two electrical connectors on the headset body is greater than or equal to a preset value. To be specific, not both the two electrical connectors are disposed at a bottom end of a rod body of the headset body. Only one electrical connector is disposed at the bottom end of the rod body, and the other electrical connector to be dispersedly disposed with the electrical connector is disposed on an outer side wall of the rod body or an outer side wall of an earbud; the two electrical connectors are dispersedly disposed on an outer side wall of the rod body; the two electrical connectors are dispersedly disposed on an outer side wall of an earbud; or one electrical connector is disposed on an outer side wall of the rod body, and the other electrical connector is disposed on an outer side wall of an earbud. Therefore, there may be more plenty of space inside the headset body to dispose each electrical connector.

In addition, the headset body may further include a battery. Referring to FIG. 2(a) and FIG. 2(b), when the two electrical connectors on the headset body 211 are electrically connected to two electrical connectors correspondingly disposed on a charging box 22 for housing the wireless headset 21, the charging box 22 may be configured to charge the battery in the headset body 211.

As a size of the wireless headset becomes smaller, interference of an electrostatic discharge (electro-static discharge, ESD), a surge, or the like in the wireless headset becomes more severe. The electrical connector that is of the wireless headset and that is exposed outside imports, into the wireless headset more easily, a high-frequency and high-voltage interference signal generated by the ESD, the surge, or the like, to interfere with or damage a component or a circuit inside the wireless headset.

To reduce impact of the high-frequency and high-voltage interference signal such as the ESD or the surge, an electrical signal input by the electrical connector of the wireless headset may pass through an anti-interference component and then be transmitted to a circuit system inside the wireless headset. The anti-interference component may be configured to suppress the high-frequency and high-voltage interference signal such as the ESD or the surge that is imported by the electrical connector from the outside, to reduce interference of the interference signal to the circuit system of the wireless headset and impact of the interference signal on the circuit system of the wireless headset, and improve system stability of the wireless headset, That the anti-interference component suppresses the high-frequency and high-voltage interference signal may include attenuating, absorbing, or filtering the high-frequency and high-voltage interference signal, so that the high-frequency and high-voltage interference signal loses high-frequency and high-voltage characteristics, to reduce impact on a component in a headset circuit.

However, addition of the anti-interference component makes space at a bottom of the rod body more limited, to increase difficulty in a circuit design inside the rod body.

In this embodiment of this application, each dispersedly disposed electrical connector may have relatively plenty of space inside the headset body to be provided with the anti-interference component, so that a circuit design inside the headset body is relatively simple.

Figure 3:
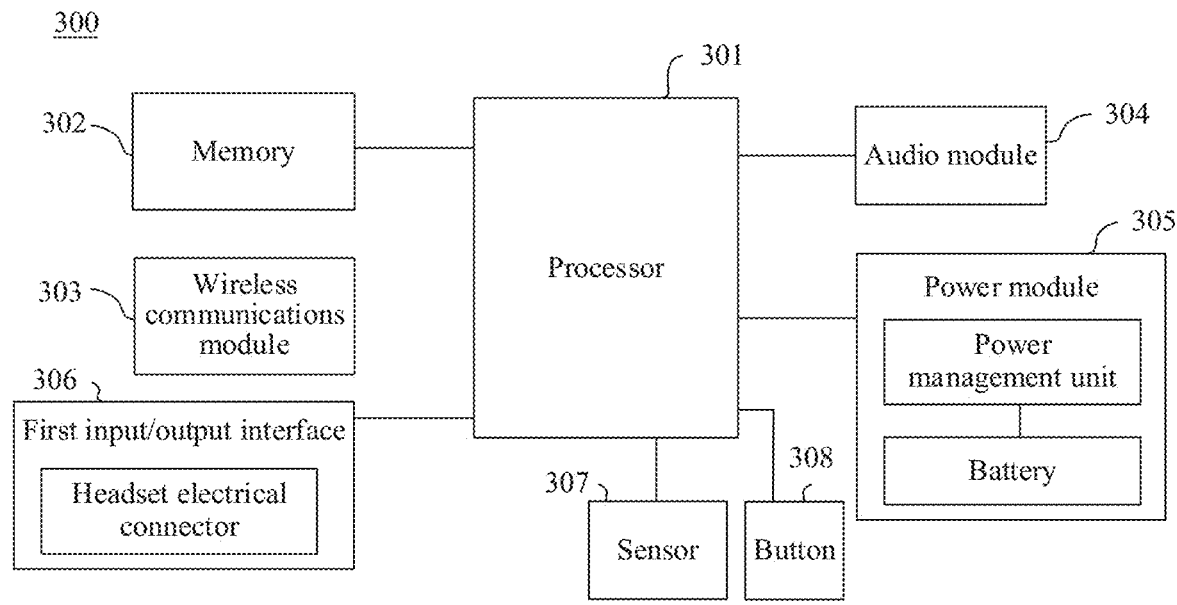
FIG. 3 is a schematic structural diagram of a wireless headset according to an embodiment of this application.

For example, FIG. 3 is a schematic structural diagram of a wireless headset 300. The wireless headset 300 may include at least one processor 301, at least one memory 302, a wireless communications module 303, an audio module 304, a power module 305, an input/output interface 306, and the like. The processor may include one or more interfaces, configured to be connected to another component of the wireless headset 300. The wireless headset 300 is housed in a headset box.

The memory 302 may be configured to store program code, for example, program code for charging the wireless headset 300, program code for performing a wireless pairing connection between the wireless headset 300 and another electronic device, or program code for performing wireless communication between the wireless headset 300 and an electronic device.

The processor 301 may be configured to execute the application code, to invoke a related module to implement a function of the wireless headset 300 in this embodiment of this application, for example, to implement a charging function, a wireless communication function, or an audio data playing function of the wireless headset 300. The processor 301 may include one or more processing units, and different processing units may be independent components, or may be integrated into one or more processors 301. The processor 301 may be specifically an integrated control chip, or may include a circuit including various active and/or passive components. The circuit is configured to perform a function of the processor 301 described in this embodiment of this application.

The wireless communications module 303 may be configured to support data exchange of wireless communication between the wireless headset 300 and the another electronic device or the headset box, for example, bluetooth (bluetooth, BT) communication, global navigation satellite system (global navigation satellite system, GLASS) communication, wireless local area network (wireless local area networks, WLAN) (for example, a wireless fidelity (wireless fidelity, Wi-Fi) network) communication, frequency modulation (frequency modulation, FM) communication, near field communication (near field communication, NFC), or infrared (infrared, IR) communication. In some embodiments, the wireless communications module 303 may be a bluetooth chip. The wireless headset 300 may be paired with and establish a wireless connection to a bluetooth chip of the another electronic device by using the bluetooth chip, to implement wireless communication between the wireless headset 300 and the another electronic device through the wireless connection.

In addition, the wireless communications module 303 may further include an antenna. The wireless communications module 303 receives an electromagnetic wave through the antenna, performs modulation and filtering processing on an electromagnetic wave signal, and sends the processed signal to the processor 301. The wireless communications module 303 may further receive a to-be-sent signal from the processor 301, perform frequency modulation and amplification on the signal, convert the signal to an electromagnetic wave through the antenna, and transmit the electromagnetic wave.

The audio module 304 may be configured to manage audio data, so that the wireless headset 300 inputs and outputs an audio signal. For example, the audio module 304 may obtain the audio signal from the wireless communications module 303, or transmit the audio signal to the wireless communications module 303, to implement a function of the wireless headset such as making or receiving a cell, playing music, enabling/disabling a voice assistant of an electronic device connected to the headset, or receiving/sending voice data of a user. The audio module 304 may include a speaker (or referred to as a receiver or a telephone receiver) assembly configured to output the audio signal, a microphone (or referred to as a microphone or a microphone), a microphone receiver circuit that cooperates with the microphone, and the like. The speaker may be configured to: convert an audio electrical signal into a sound signal, and play the sound signal. The microphone may be configured to convert a sound signal into an audio electrical signal.

The power module 305 may be configured to: provide a system power supply of the wireless headset 300, to supply power to each module of the wireless headset 300, support the wireless headset 300 in receiving a charging input, and the like. The power module 305 may include a power management unit (power management unit, PMU) and a battery (for example, a first battery). The power management unit may include a charging circuit, a voltage drop adjustment circuit, a protection circuit, an electricity measurement circuit, and the like. The charging circuit may receive an external charging input. The voltage drop adjustment circuit may change a voltage of an electric signal input by the charging circuit, and then output the electric signal to the battery, to complete charging of the battery; or may change a voltage of an electric signal input by the battery, and output the electric signal to another module such as the audio module 304 or the wireless communications module 303. The protection circuit may he configured to prevent overcharge, overdischarge, a short circuit, or overcurrent of the battery. In some embodiments, the power module 305 may further include a wireless charging coil, and is configured to wirelessly charge the wireless headset 300. In addition, the power management unit may be further configured to monitor parameters such as a battery capacity, a quantity of battery cycles, and a battery health status (for example, leakage or impedance).

A plurality of first input/output interfaces 306 may be configured to provide a wired connection between the wireless headset 300 and the headset box for charging or communication. In some embodiments, the first input/output interface 306 may include a headset electrical connector, and the headset electrical connector is configured to conduct and transmit a current. When the wireless headset 300 is placed in the headset box, the wireless headset 300 may establish an electrical connection to an electrical connector in the headset box through the headset electrical connector (for example, the headset electrical connector is in direct contact with the electrical connector in the headset box). After the electrical connection is established, the headset box may charge the battery in the wireless headset 300 through a current transmission function of the headset electrical connector and the electrical connector in the headset box. For example, the headset electrical connector may be a pogo pin, a spring pin, a spring plate, a conducting block, a conductive patch, a conductive sheet, a pin, a plug, a contact pad, a jack, a socket, or the like. A specific type of the electrical connector is not limited in this embodiment of this application.

Specifically, the wireless headset 300 may include a pair of headset bodies that is used in cooperation with the left ear and the right ear of the user, and each headset body may include two dispersedly disposed headset electrical connectors. When the headset body is placed in the headset box, the headset body may establish, through the two headset electrical connectors, an electrical connection to two electrical connectors correspondingly disposed in the headset box. After the electrical connection is established, the headset box may charge the battery in the headset body.

In some other embodiments, after the electrical connection is established, the wireless headset 300 may further perform data communication with the headset box, for example, may receive a pairing instruction from the headset box.

In addition, the wireless headset 300 may further include a sensor 307. For example, the sensor 307 may be a distance sensor or an optical proximity sensor, and may be configured to determine whether the wireless headset 300 is worn by the user. For example, the wireless headset 300 may detect, by using the distance sensor, whether there is an object near the wireless headset 300, to determine whether the wireless headset 300 is worn by the user. When determining that the wireless headset 300 is worn, the wireless headset 300 may open the speaker. In some embodiments, the wireless headset 300 may further include a bone conduction sensor, to form a bone conduction headset. Based on the bone conduction sensor, the wireless headset 300 may obtain a vibration signal of an acoustic vibration bone block, parse out a speech signal, and implement a speech function.

For another example, an outer surface of the wireless headset 300 may further include a touch sensor, configured to detect a touch operation of the user; a fingerprint sensor, configured to: detect a user fingerprint, identify a user identity, and the like; an ambient light sensor that can adaptively adjust some parameters (for example, a volume) based on brightness of perceived ambient light; and some other sensors.

It may be understood that, a structure illustrated in this embodiment of this application does not constitute a specific limitation on the wireless headset 300. The wireless headset 300 may have more or fewer components than those shown in FIG. 3, may combine two or more components, or may have a different component configuration. For example, the outer surface of the wireless headset 300 may further include components such as a bottom 308, an indicator (which may indicate a status such as a quantity of electricity, an incoming/outgoing call, or a pairing mode), a display (which may prompt the user with related information), and a dust filter (which may be used in cooperation with a receiver). The button 308 may be a physical button, a touch button (used in cooperation with the touch sensor), or the like, and is configured to trigger an operation such as turning on, turning off, pausing, playing, recording, starting charging, or stopping charging.

The various components shown in FIG. 3 may be implemented in hardware, software, or a combination of hardware and software including one or more signal processing or application-specific integrated circuits.

FIG. 2(a) and FIG. 2(b) are a schematic diagram of two headset boxes 22 for housing a wireless headset 21. In some embodiments, there may be one or more magnets inside the headset box, to attract a headset body into a cavity inside the headset box. The headset box may include a case power module and a plurality of second input/output interfaces. The case power module may supply power to an electrical component in the headset box, and the case power module may include a case battery (namely, a second battery). In some embodiments, the second input/output interface may be a case electrical connector, and the case electrical connector is electrically connected to an electrode of the case power module, and may be configured to conduct and transmit a current. The headset box may include two pairs of case electrical connectors respectively corresponding to two headset bodies. When a pair of case electrical connectors in the headset box is respectively electrically connected to two headset electrical connectors in the headset body, the headset box may charge a battery in the headset body through the case battery of the headset box.

The case electrical connector is used in cooperation with the headset electrical connector. For example, when the case electrical connector is a spring pin, the headset electrical connector may be a conducting block, a conductive sheet, or the like. When the headset electrical connector is a conductive patch, the case electrical connector may be a conductive sheet, a contact pad, or the like. The headset electrical connector and the case electrical connector may establish an electrical connection in a plurality of manners such as surface contact, an inline connection, a threaded connection, and a bayonet connection.

In some other embodiment, the headset box may be provided with at least one touch control that may be configured to trigger a function such as pairing reset of the wireless headset or charging the wireless headset. The headset box may be further provided with one or more electricity indicators, to prompt a user with a quantity of electricity of the battery in the headset box and a quantity of electricity of a battery in each headset body in the headset box.

In some other embodiments, the headset case may further include components such as a processor and a memory. The memory may be configured to store application code, and execution of the application code is controlled by the processor of the headset box, to implement various functions of the headset box. For example, the processor of the headset box executes the application code stored in the memory, to charge the wireless headset and so on after it is detected that the wireless headset is placed in the headset box and a cover of the headset box is closed.

In addition, the headset box may be further provided with a charging interface, configured to charge the battery of the headset box. The headset box may further include a wireless charging coil, configured to wirelessly charge the battery of the headset box. It may be understood that the headset box may further include other components, and the components are not listed for description herein.

Figure 4A:
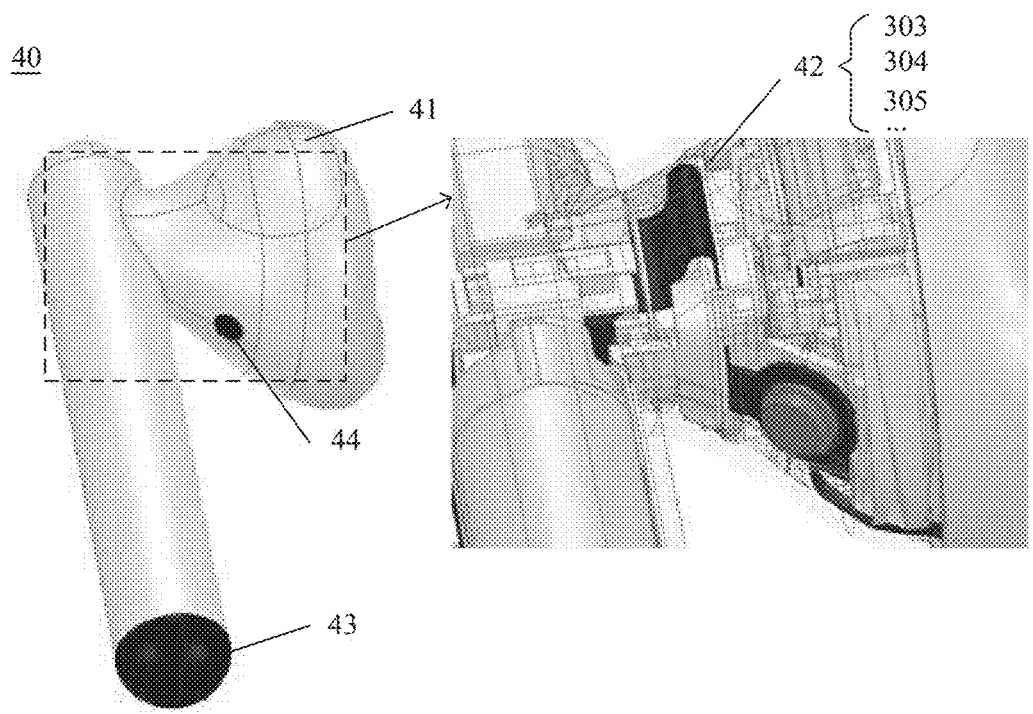
FIG. 4A is a schematic diagram of a headset body according to an embodiment of this application.

In some embodiments of this application, FIG. 4A is a schematic structural diagram of a headset body 40 in a wireless headset. The headset body 40 may include a housing 41 and an internal component 42. The internal component 42 is disposed in a cavity enclosed by the housing 41. The internal component 42 may include a component in the foregoing modules such as the wireless communications module 303, the audio module 304, and the power module 305. The headset body may further include a first headset electrical connector (namely, a first electrical connector) 43 and a second headset electrical connector (namely, a second electrical connector) 44 that are connected to the internal component and that are dispersedly disposed on the housing.

The first headset electrical connector and the second headset electrical connector that are dispersedly disposed on the housing are exposed outside the headset body, to facilitate contact with a case electrical connector to establish an electrical connection. The first headset electrical connector and the second headset electrical connector may be connected to the internal component in a plurality of manners such as crimping, soldering, snapping on, and wire wrapping.

Figure 4B:
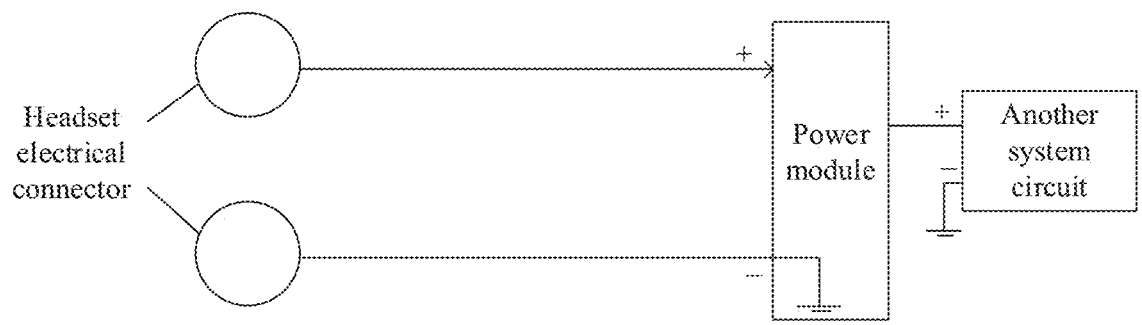
FIG. 4B is a diagram of a circuit principle according to an embodiment of this application.

In addition, the first headset electrical connector and the second headset electrical connector are respectively electrically connected to electrodes (to be specific, a positive electrode or a negative electrode, or referred to as an anode or a cathode) of the power module of the headset body, to charge a battery in the headset body. The power module may supply power to another system circuit. For a diagram of a corresponding circuit principle, refer to FIG. 4B. During charging, a charging signal imported through a headset electrical connector may enter the power module, to charge the battery in the power module. Usually, both a negative electrode of the power module and a negative electrode of the another circuit are grounded.

Figure 4C:
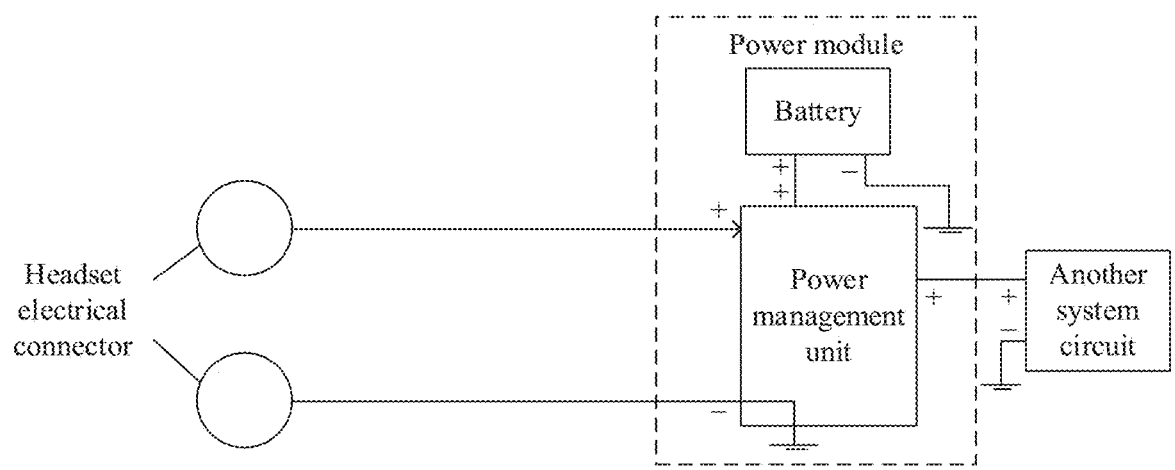
FIG. 4C is a diagram of another circuit principle according to an embodiment of this application.

In some embodiments, after a power management unit performs processing such as voltage adjustment on an electrical signal input by the headset electrical connector, the battery in the headset body is charged. Therefore, referring to FIG. 4C, the first headset electrical connector and the second headset electrical connector may be respectively connected to electrodes of the power management unit. During charging, the charging signal imported through the headset electrical connector may first enter the power management unit, is processed by the power management unit, and then is input to the battery for charging. In addition, after the power management unit performs processing such as voltage step-up/voltage step-down on a quantity of electricity of the battery, the quantity of electricity of the battery may be used to supply power to the another system circuit.

Figure 5A:
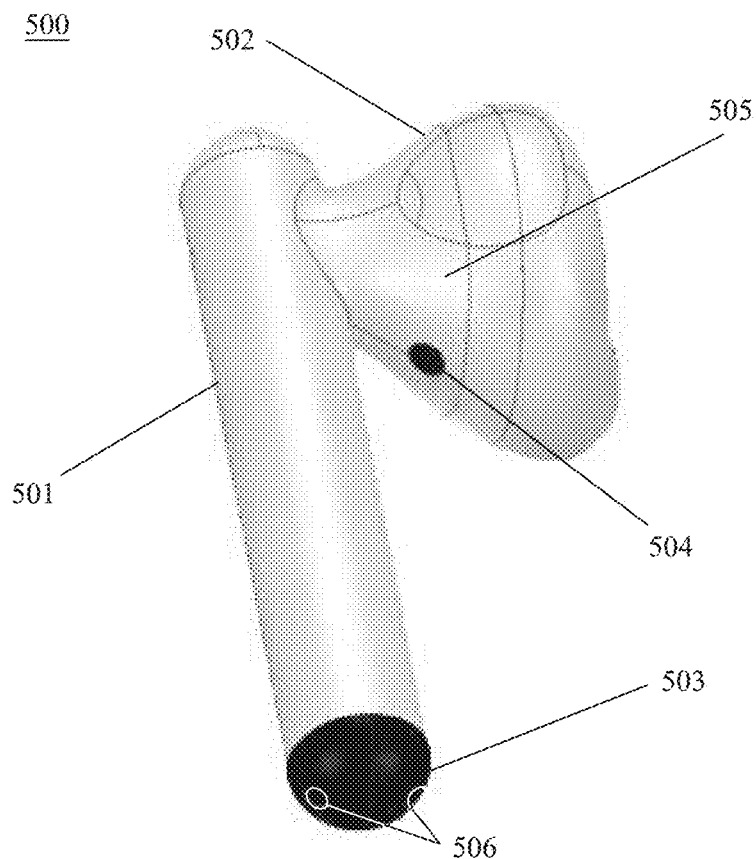
FIG. 5A is a schematic diagram of locations of a group of headset electrical connector according to an embodiment of this application.

FIG. 5A is a schematic structural diagram of a headset body 500. The headset body 500 may include a rod body 501 and an earbud 502 connected to a top of the rod body 501. The rod body 501 and the earbud 502 may include internal components such as a circuit board and a battery. The circuit board may include various components such as a processor, a memory, and a charging circuit, to implement various functions such as the wireless communications module 303, the audio module 304, and the power module 305. For example, a battery may be disposed inside a cavity of the rod body 501. A speaker assembly in the audio module 304 may be disposed inside a cavity of the earbud 502. When a user wears the earbud, the user may hear a sound signal from the speaker assembly, to implement a function such as playing music, receiving/making a call for the user. A first headset electrical connector is disposed at a bottom end of the rod body 501, and is exposed outside the headset body 500. A second headset electrical connector is disposed on a location that is on the headset body 500 and that is other than the bottom end of the rod body 501, to be dispersedly disposed with the first headset electrical connector.

When only one first headset electrical connector is disposed at the bottom end of the rod body, entire space at a bottom of the rod body may be used to dispose the first headset electrical connector. Therefore, the first headset electrical connector has a relatively large area, a contact area between the first headset electrical connector and a case electrical connector is relatively large during charging, contact performance is relatively good, contact resistance is relatively small, and charging efficiency is relatively high.

In addition, when only one headset electrical connector is disposed at the bottom end of the rod body, the bottom end of the rod body may be designed more beautifully. When another headset electrical connector is disposed on a location that is on an outer side wall of the earbud and that is opposite to a side that is of the rod body and that extends towards the bottom end (or referred to as a location that faces the side that is of the rod body and that extends towards the bottom end), the headset electrical connector is not easily seen by the user, and may be blocked by the rod body or the earbud, so that the headset body seems to be more simple and beautiful.

In some embodiments, the first headset electrical connector is disposed at the bottom end of the rod body 501, and the second headset electrical connector is disposed on any location on the outer side wall 505 of the earbud 502, to be dispersedly disposed with the first headset electrical connector.

For example, as shown in FIG. 5A, the first headset electrical connector 503 is disposed at a rod end at the bottom of the rod body 501, or the first headset electrical connector 503 is disposed at the bottom end of the rod body 501, and is disposed in cooperation with the rod body 501. The first headset electrical connector 503 is not on an outer side wall of the rod body 501. The second headset electrical connector 504 is disposed on a location that is on the outer side wall 505 of the earbud 502 and that is opposite to the rod body 501 (or referred to as a location that faces the rod body 501).

The first headset electrical connector 503 shown in FIG. 5A may be electrically connected to one electrode of a system power supply in the headset body 500; an opening may be disposed on the location that is on the outer side wall 505 of the earbud 502 and that is opposite to the side that is of the rod body 501 and that extends towards the bottom end; and the second headset electrical connector 504 passes through the opening and is electrically connected to the other electrode of the system power supply in the headset body 500.

Figure 5B:
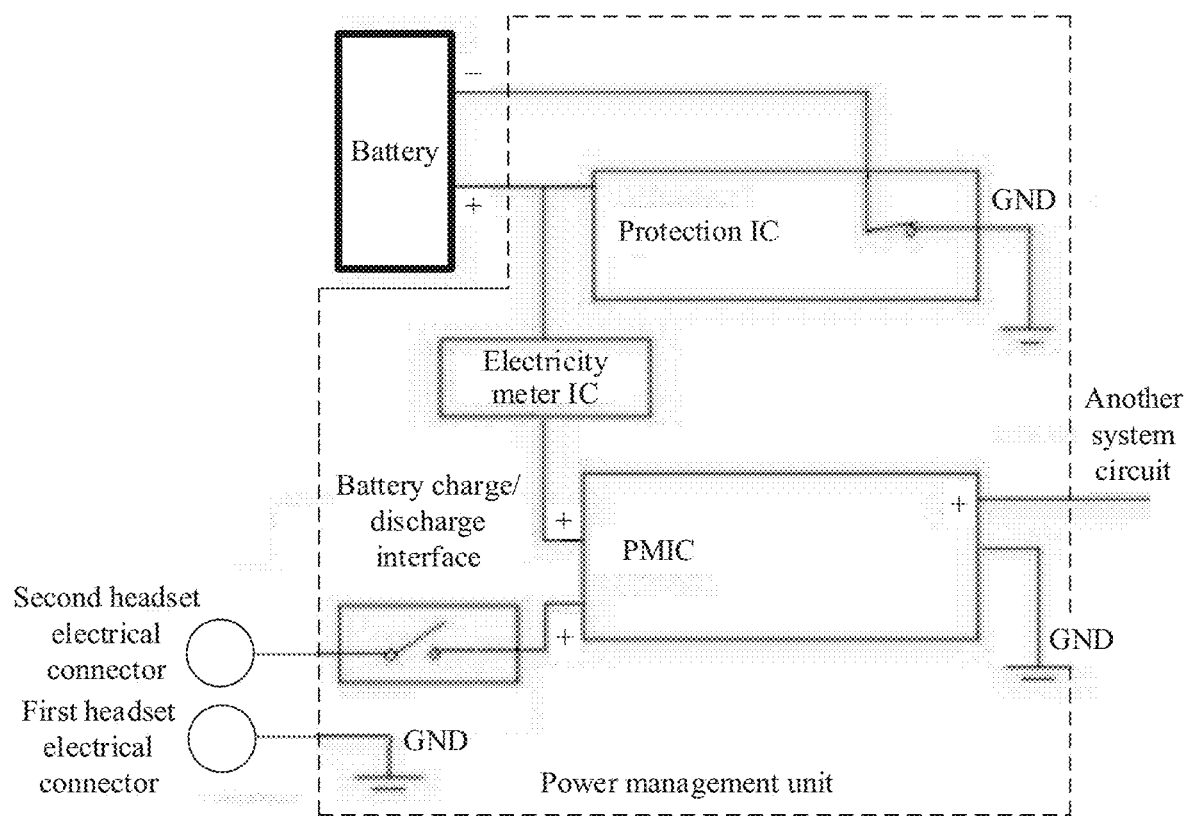
FIG. 5B is a diagram of another circuit principle according to an embodiment of this application.

In some embodiments, referring to a circuit diagram shown in FIG. 5B, the first headset electrical connector 503 and the second headset electrical connector 504 are respectively electrically connected to two electrodes of a power management unit. The power management unit may include a battery charge/discharge interface, an electricity meter integrated circuit (integrated circuit, IC) for measuring a quantity of electricity, a protection IC, a power management integrated circuit (power management integrated circuit, PMIC), and the like. The PMIC has functions of circuits such as a charging circuit and a voltage drop adjustment circuit. The second headset electrical connector is electrically connected to the battery charge/discharge interface, and is electrically connected to a positive electrode of an input end of the PMIC through the battery charge/discharge interface.. After processing such as voltage step-up/voltage step-down is performed, a positive electrode of an output end of the PMIC is electrically connected to a positive electrode of the batter and a positive electrode of the protection IC through the electricity meter IC. The first headset electrical connector is grounded (GND). In addition, both a negative electrode of the PMIC and a negative electrode of the protection IC are grounded. In other words, the first headset electrical connector is electrically connected to the negative electrode of the PMIC and the negative electrode of the protection IC. In other words, the first headset electrical connector is electrically connected to a negative electrode of the power management unit through a ferrite bead. In addition, as shown in FIG. 5B, the PMIC is further electrically connected to another system circuit, so that after the PMIC performs processing such as voltage adjustment on a quantity of electricity of the battery, the PMIC outputs the quantity of electricity to supply power to the another system circuit.

In some embodiments, the circuit board inside the headset body may be a flexible-rigid board, to be specific, a circuit board in which a flexible board (flexible circuit board) and a rigid board (hard circuit board) are combined. For example, the circuit board may include a first rigid board, a second rigid board, and a flexible board for connecting the first rigid board and the second rigid board. The first rigid board is a main board, and another circuit in the audio module (for example, an audio output circuit), the charging circuit and a protection circuit in the power management unit, a data processing circuit in the wireless communications module, and the like are mainly disposed on the main board. The second rigid board may be provided with a microphone receiver circuit. The flexible board may be provided with a flat cable for electrically connecting the first rigid board and the second rigid board. The second rigid board may be disposed at the bottom of the rod body. The flexible board can be disposed inside the rod body. The first rigid board may be disposed inside the earbud.

In addition, as shown in FIG. 5A, the bottom end of the rod body 501 may be further provided with one or more second sound receiving holes 605. The second sound receiving hole 605 may penetrate through the first headset electrical connector 503, so that a speech signal from the user may be transmitted to a microphone on the second rigid board through the second sound receiving hole 605 and a first sound receiving hole on the second rigid board, to implement sound receiving of the microphone.

In some embodiments, the first headset electrical connector is electrically connected to a negative electrode of a circuit on the second rigid board. Because negative electrodes of circuits on the circuit board are usually electrically connected together (for example, are all grounded), the first headset electrical connector is electrically connected to the negative electrode of the power management unit and a negative electrode of the system power supply when the first headset electrical connector is electrically connected to the negative electrode of the circuit on the second rigid hoard.

When the first headset electrical connector and the second headset electrical connector establish an electrical connection to the case electrical connector, the first headset electrical connector may receive an input electrical signal from the headset box, and the electrical signal is processed by the power management unit, and then input to the battery for charging.

Figure 6A:
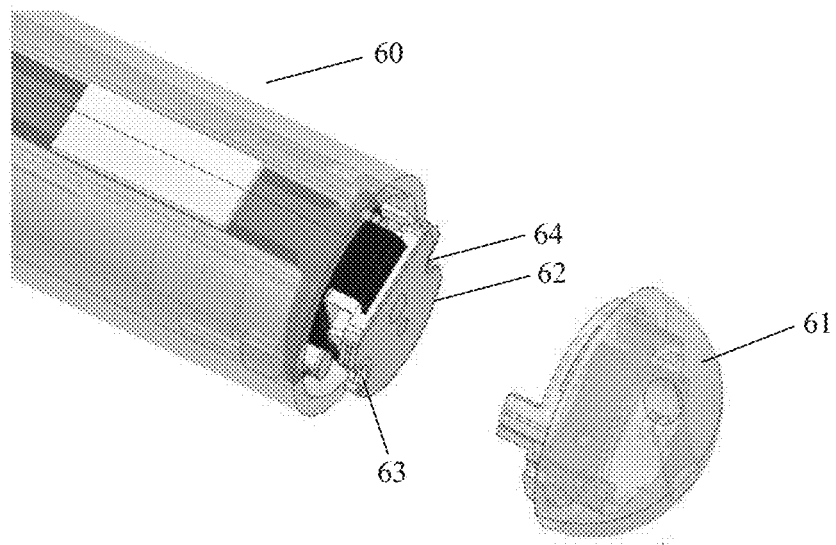
FIG. 6(a) and FIG. 6(b) are a schematic diagram of a structure and a connection of a headset electrical connector according to an embodiment of this application.
Figure 6B:
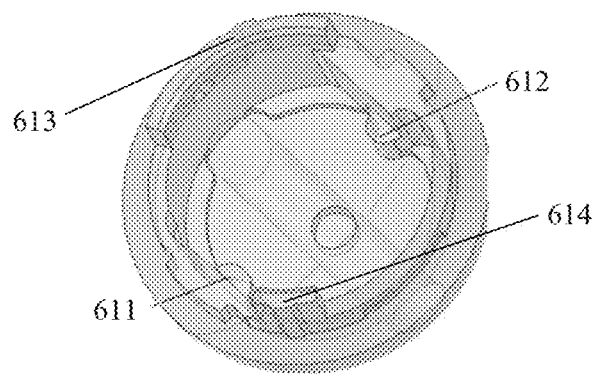

The first headset electrical connector and the second headset electrical connector may be of a same type, or may be of different types, and may further have a plurality of different installation manners. For example, the first headset electrical connector 503 shown in FIG. 5A may be specifically a hemispherical conductor 61 that cooperates with a rod end shown in FIG. 6(a). In some embodiments, the entire hemispherical conductor 61 may be a conductive material, for example, a metal or an alloy. In some other embodiments, the hemispherical conductor 61 is made by plating an outer surface of a hemispherical plastic body with a conducting material. In this case, the first headset electrical connector has a relatively light weight, and the headset body is lighter. In addition, as shown in FIG. 6(a), a second rigid board 62 at a bottom of a rod body 60 forms a snap-on groove 63 and a snap-on groove shaped pad 64. As shown in FIG. 6(b), a snap-on component 611 and a connection component 612 are disposed on the conductor 61. The snap-on component 611 may match a shape and a size of the snap-on groove 63 and form a protrusion inwards (or referred to as a step that extends inwards). The connection component 612 may match a shape and a size of the snap-on groove shaped pad 64 and form a protrusion inwards (or referred to as a step that extends inwards). The snap-on component 611 is snapped into a location at which the snap-on groove 63 is located, and the connection component 612 is soldered to a location at which the snap-on groove shaped pad 64 is located, so that the conductor 61 is connected to the second rigid board 62. In addition, the conductor 61 may further include another component, configured to fasten the conductor 61 to a bottom end of the rod body 60. For example, as shown in FIG. 6(b), the conductor 61 includes a component 613 and a component 614 that protrude outwards, and may be adhered to a housing of the rod body 60 by using an adhesive, so that the conductor 61 is fastened to the bottom end of the rod body 60.

Figure 7A:
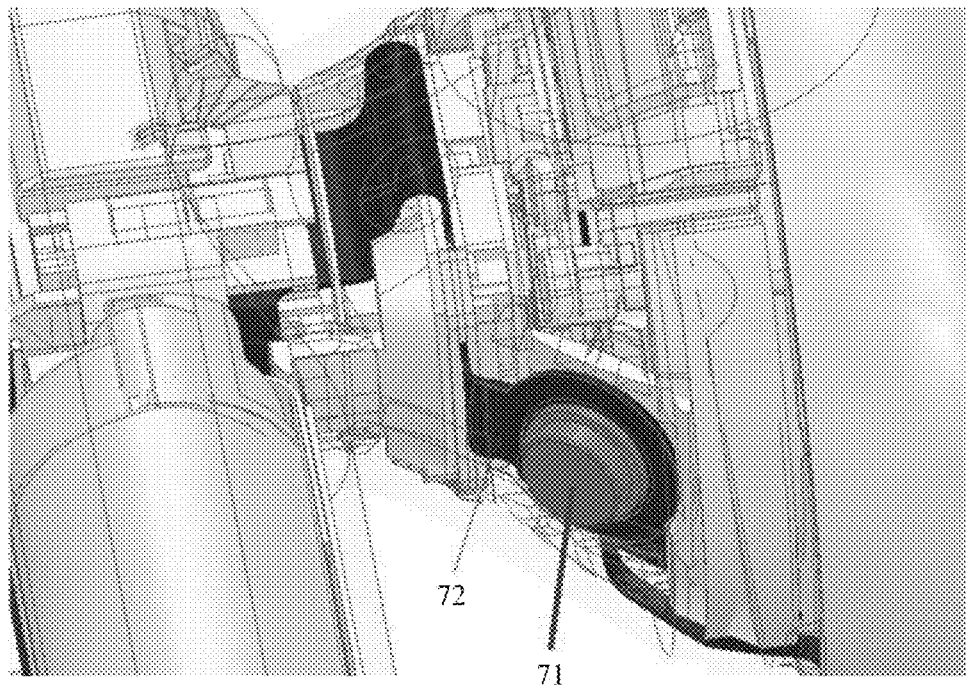
FIG. 7A is a schematic diagram of a connection of a headset electrical connector according to an embodiment of this application.

For example, the second headset electrical connector 504 shown in FIG. 5A may be specifically a conductive patch 71 shown in FIG. 7A, and the conductive patch 71 is attached to a flexible board 72 and connected to a positive electrode of the power management unit, in other words, is connected to the positive electrode of the system power supply. A housing of the headset body is provided with an opening, and the conductive patch 71 may protrude from the opening, to be exposed outside the headset body, to facilitate contact with the case electrical connector. The conductive patch 71 may be attached to the flexible board 72, and then inserted into the housing together with the flexible board 72.

Figure 7B:
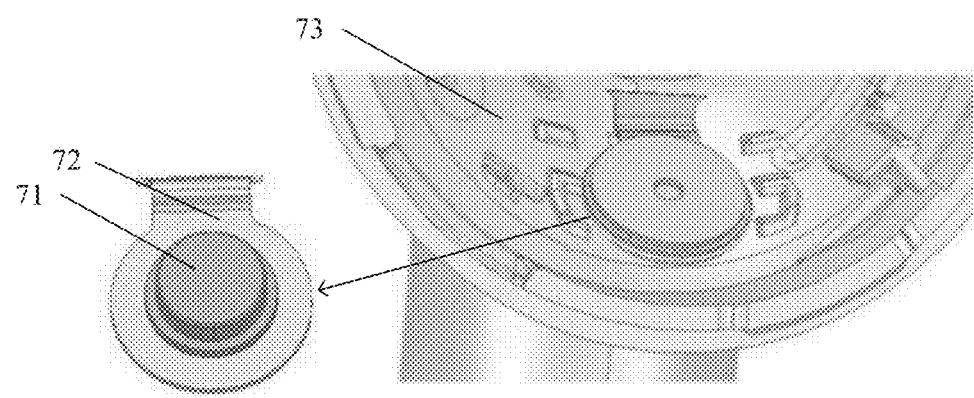
FIG. 7B(a) and FIG. 7B(b) are a schematic diagram of a connection of another headset electrical connector according to an embodiment of this application.
Figure 7C:
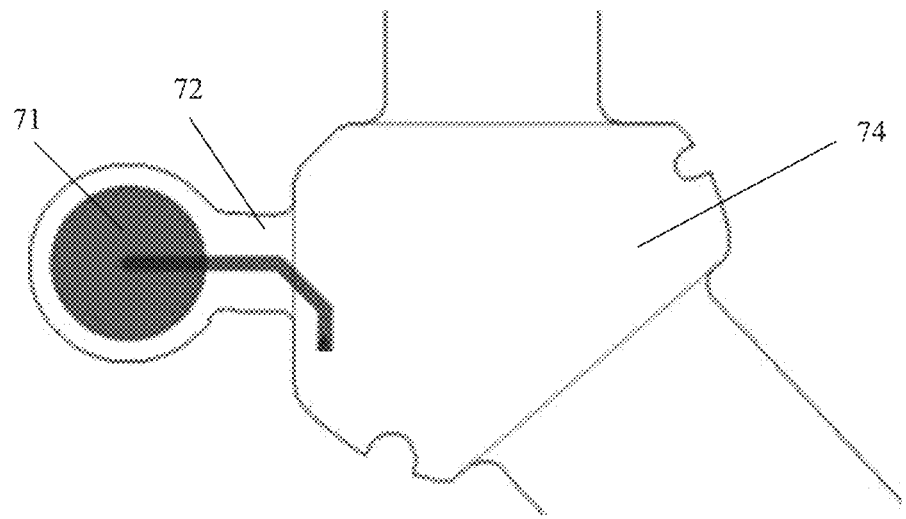
FIG. 7C is a schematic diagram of a circuit board according to an embodiment of this application.

For example, the second headset electrical connector 504 shown in FIG. 5A may be specifically the conductive patch 71 shown in FIG. 7A and FIG. 7B(a) and FIG. 7B(b). The conductive patch 71 is soldered to the flexible board 72, and is electrically connected to the positive electrode of the power management unit on the first rigid board through the ferrite bead, in other words, is electrically connected to a positive electrode of the power module. A housing of the headset body is provided with an opening, and the conductive patch 71 may protrude from the opening, to be exposed outside the headset body, to facilitate contact with the case electrical connector. The conductive patch 71 may be soldered to the flexible board 72, and then inserted into a housing 73 of the earbud together with the flexible hoard 72. In addition, during installation, the conductive patch 71 may be coated with an adhesive material (for example, a hot melt adhesive), so that the conductive patch is fastened to the housing 73 of the earbud. For example, referring to FIG. 7C, the conductive patch 71 may be electrically connected to a positive electrode of a power management unit on a first rigid board 74.

The flexible board 72 may be disposed inside the rod body 60 in a configuration direction of the rod body 60, to connect the second rigid board 62 at the bottom of the rod body 60 and the first rigid board inside the earbud. In addition, the battery in the headset body may be a long strip, and is disposed inside the rod body 60 in the configuration direction of the rod body 60.

Figure 8:
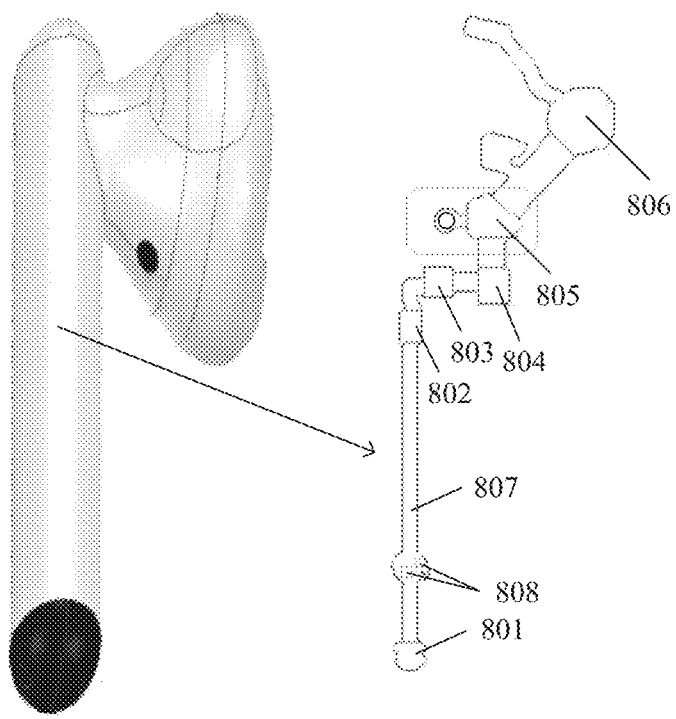
FIG. 8 is a schematic diagram of a connection of a circuit board of a headset body according to an embodiment of this application.

In some embodiments, as shown in FIG. 8, a cavity of the headset body may include a plurality of rigid boards, and a flexible board for connecting the plurality of rigid boards. The second rigid board may be a rigid board 801 disposed at the bottom of the rod body, and the first headset electrical connector may be disposed on the rigid board 801. The first rigid board may include a rigid hoard 802 to a rigid board 806 shown in FIG. 8. The battery may be soldered to a flexible board 807 through a soldered joint 808 on the flexible board 807, to be electrically connected to the first rigid board through the flexible board 807. The second headset electrical connector may be disposed on the flexible board and electrically connected to a power management unit on the rigid board 805 in the first rigid board through the flexible board. The rigid board 805 may include some or all power management units. For example, a PMIC is disposed on the rigid board 5. The rigid board 802 to the rigid board 806 may further include other circuits in an existing wireless headset such as a data processing circuit and an audio processing circuit in the wireless communications module. For details, refer to the conventional technology. Details are not described in this embodiment of this application.

It can be understood that the first headset electrical connector may alternatively be in a form other than that shown in FIG. 6(a) and FIG. 6(b), and the second headset electrical connector may alternatively be in a form other than that shown in FIG. 7A. This is not limited in this embodiment of this application. For example, the first headset electrical connector may alternatively be a spring plate, a contact pad, or the like, and the second electrical connector may alternatively be a pogo pin, a pin, or the like.

In some other embodiments, in the first headset electrical connector and the second headset electrical connector that are dispersedly disposed, at least one headset electrical connector may be electrically connected to an electrode (the positive electrode or the negative electrode) of the system power supply of the headset body through an anti-interference component. The anti-interference component may be configured to attenuate a high-frequency and high-voltage interference signal that is generated by an ESD, a surge, or the like and that is imported through a headset electrical connector, to reduce interference that is of the high-frequency and high-voltage interference signal imported through the electrical connector and that is to a circuit system of the headset body and impact of the high-frequency and high-voltage interference signal on the circuit system of the headset body, and improve system stability of the wireless headset. For example, the anti-interference component may be a component that occupies relatively small space, for example, a ferrite bead or a resistor.

For example, in a case shown in FIG. 5A, a distance between the two headset electrical connectors is relatively long, and each headset electrical connector can have relatively plenty of space inside the headset body to be provided with the anti-interference component, to reduce a quantity of high-frequency and high-voltage interference signals such as the ESD and the surge, reduce impact of the interference signal on an internal circuit system of the headset body, and reduce difficulty in a circuit design. For example, the first headset electrical connector shown in FIG. 5A may be connected to the negative electrode of the system power supply or the negative electrode of the power management unit through a first anti-interference component and a connection line, and the second headset electrical connector may be electrically connected to the positive electrode of the system power supply.

In some other embodiments, the first headset electrical connector shown in FIG. 5A may alternatively be connected to the positive electrode of the system power supply or the positive electrode of the power management unit through the first anti-interference component and the connection line, and the second headset electrical connector may alternatively be electrically connected to the negative electrode of the system power supply.

Because the first headset electrical connector at the bottom end of the rod body is usually in contact with the face of the user, in comparison with a case in which the first headset electrical connector at the bottom end of the rod body is electrically connected to the positive electrode of the power management unit, when the first headset electrical connector at the bottom end of the rod body is grounded, to be electrically connected to the negative electrode of the power management unit, impact of corroding the first headset electrical connector due to ionization, and the like when the user sweats may be better avoided.

Figure 9A:
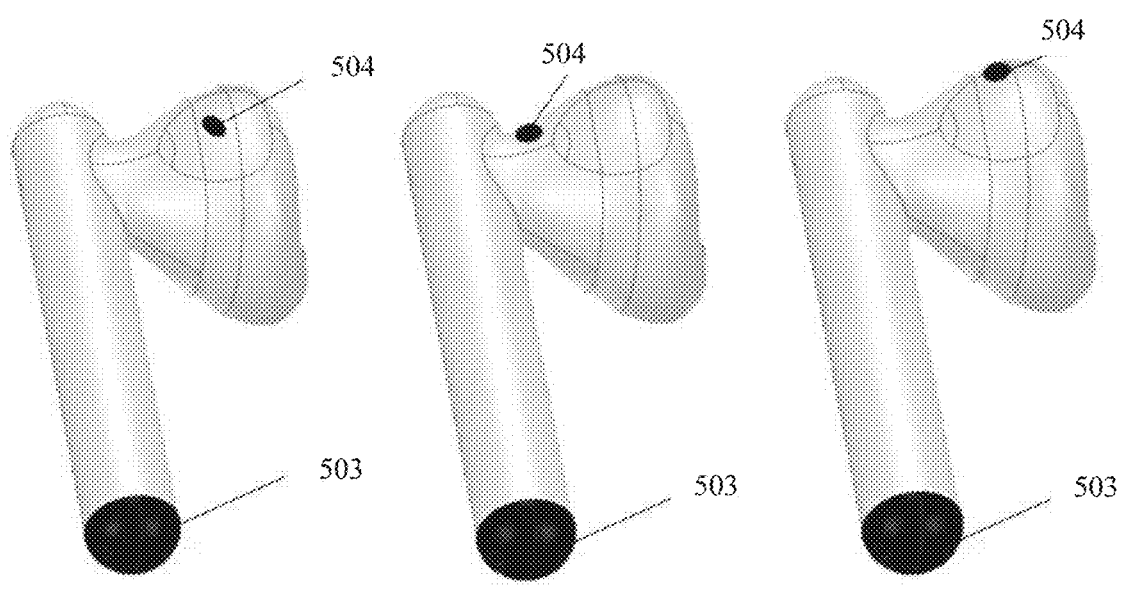
FIG. 9A(a) to FIG. 9A(c) are a schematic diagram of locations of several groups of headset electrical connectors according to an embodiment of this application.
Figure 9B:
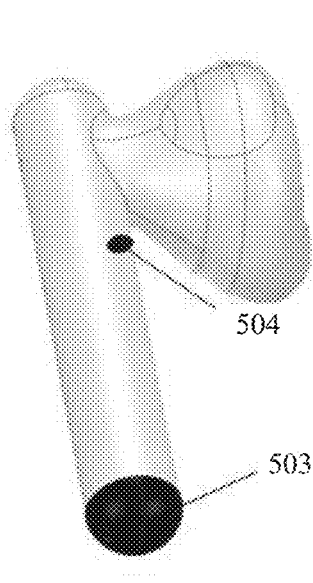
FIG. 9B(a) to FIG. 9B(c) are a schematic diagram of locations of other several groups of headset electrical connectors according to an embodiment of this application.
Figure 9B:
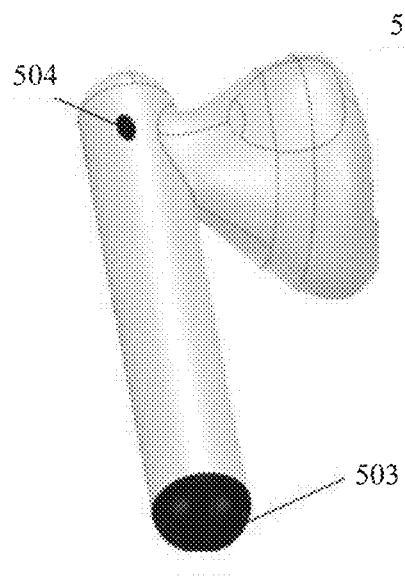
Figure 9B:
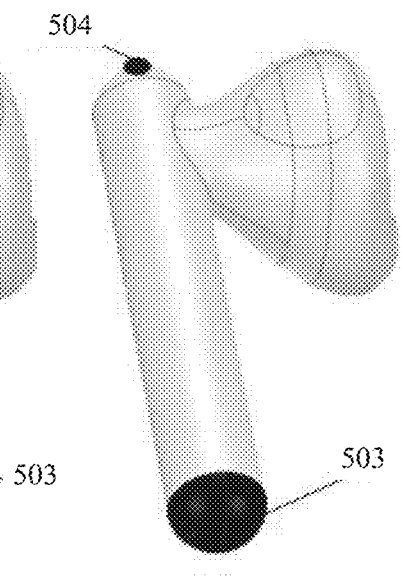

In some other embodiments, when the first headset electrical connector is disposed at the bottom end of the rod body 501, the second headset electrical connector dispersedly disposed with the first headset electrical connector may be located on a location that is on the outer side wall of the earbud 502 and that is other than the location shown in FIG. 5A. For example, the second headset electrical connector may be located on a location shown in FIG. **9A(*a*) to FIG. 9A(*c*). For another example, as shown in FIG. 9B(*a*) to FIG. 9B(*c*)**, the first headset electrical connector is located at the bottom end of the rod body, and the second headset electrical connector is located on the outer side wall of the rod body and on an end that is close to the top of the rod body, in other words, on an end that is far away from the bottom of the rod body.

Figure 10A:
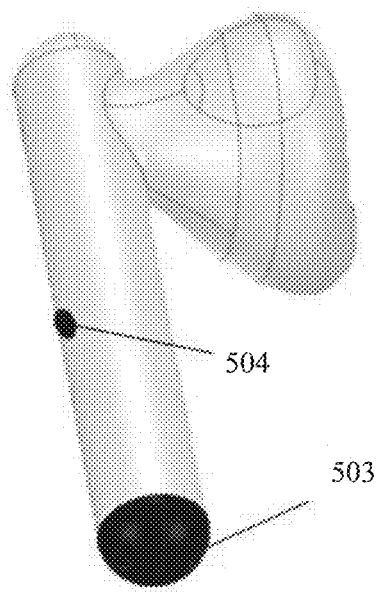
FIG. 10(a) and FIG. 10(b) are a schematic diagram of locations of two groups of headset electrical connectors according to an embodiment of this application.
Figure 10B:
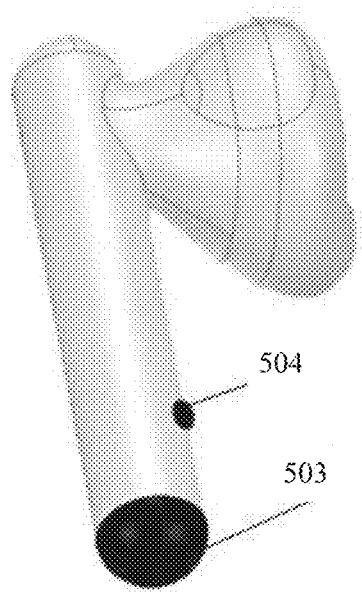

In some other embodiments, as shown in FIG. **10(*a*) or FIG. 10(*b*)**, the first headset electrical connector is located at the bottom end of the rod body, the second headset electrical connector is located on the outer side wall of the rod body, and the distance between the two headset electrical connectors is greater than or equal to a first preset value (for example, may be 1 cm).

Therefore, each of headset electrical connectors that are dispersedly disposed can have relatively plenty of space inside the headset body to be provided with the anti-interference component, so that impact of the high-frequency and high-voltage interference signal such as the ESD or the surge on the circuit system can be reduced, and difficulty in the circuit design inside the headset body can be reduced.

Figure 11A:
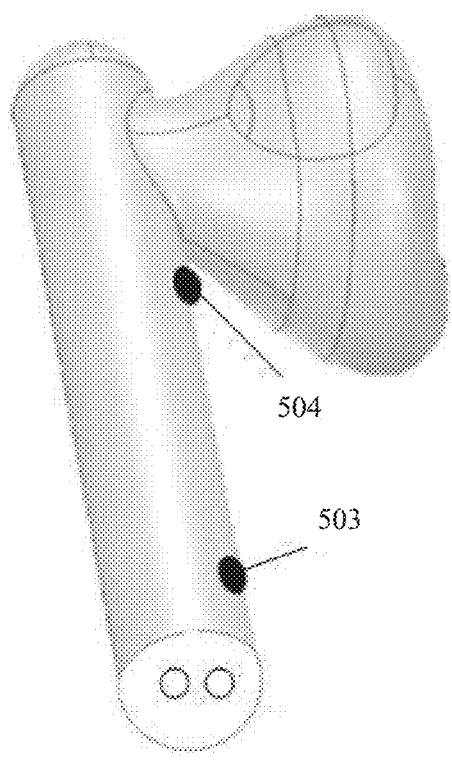
FIG. 11(a) and FIG. 11(b) are a schematic diagram of locations of other two groups of headset electrical connectors according to an embodiment of this application.
Figure 11B:
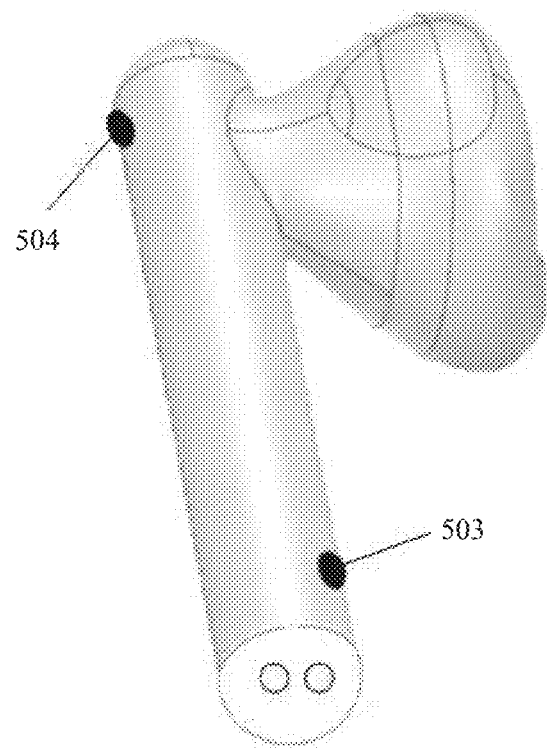

In some other embodiments, the first headset electrical connector and the second headset electrical connector may be dispersedly disposed on a location other than the bottom end of the rod body. For example, both the first headset electrical connector and the second headset electrical connector are disposed on the outer side wall of the rod body, and the distance between locations of the two headset electrical connectors is greater than or equal to a second preset value (for example, may be 2 cm). For example, as shown in FIG. **11(*a*) or FIG. 11(*b*)**, both the first headset electrical connector and the second headset electrical connector are disposed on the outer side wall of the rod body, one is disposed close to the top of the rod body, and the other is disposed close to the bottom of the rod body.

Figures 12A, 12B, 12C:
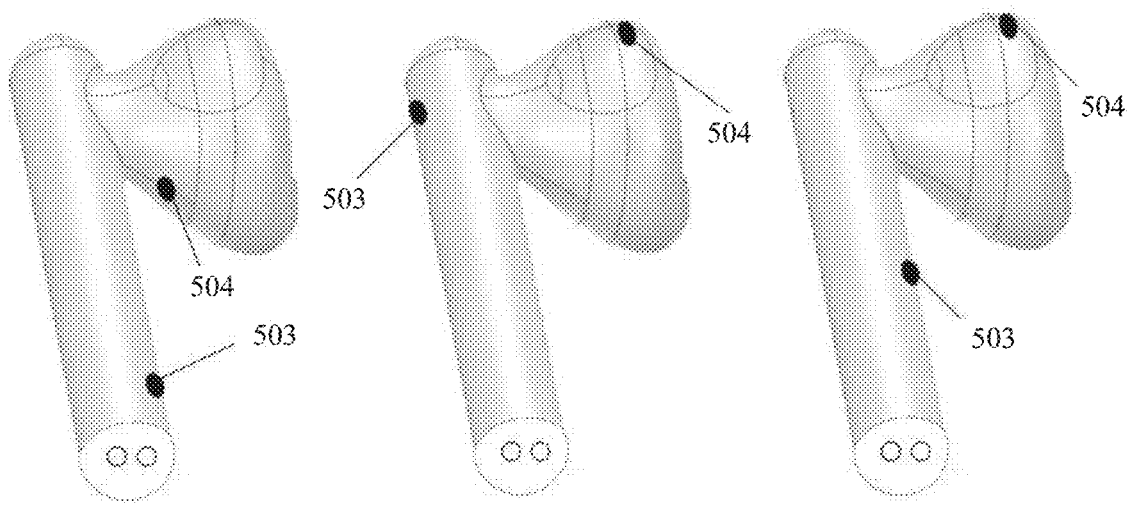
FIG. 12(a) to FIG. 12(c) are a schematic diagram of locations of other several groups of headset electrical connectors according to an embodiment of this application.

For another example, as shown in FIG. **12(*a*) to FIG. 12(*c*)**, the first headset electrical connector is disposed on the outer side wall of the rod body, and the second headset electrical connector is disposed on the outer side wall of the earbud body.

Figure 13:
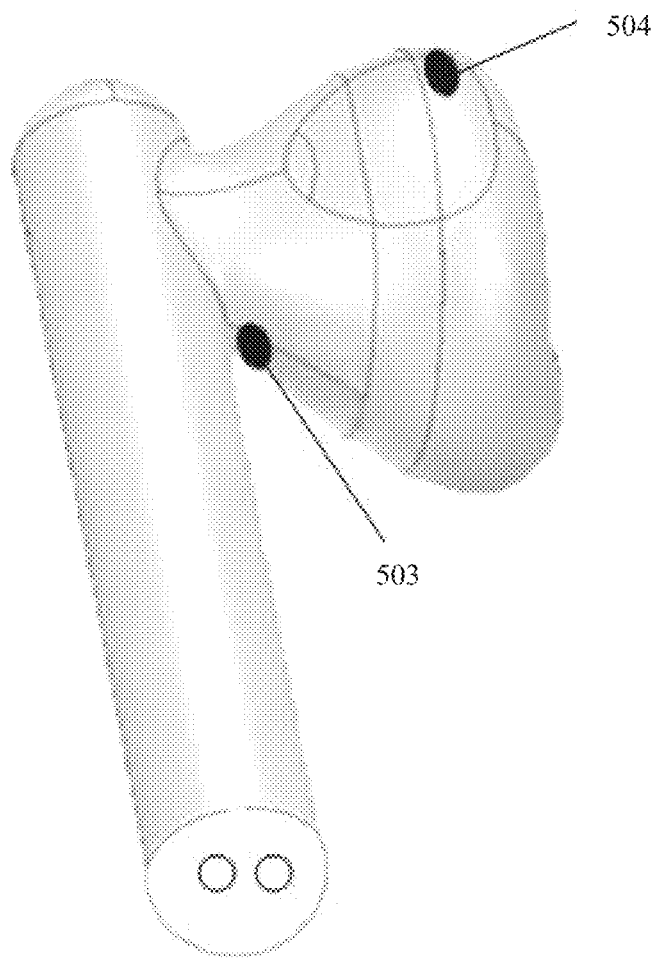
FIG. 13 is a schematic diagram of locations of a group of headset electrical connectors according to an embodiment of this application.

For another example, both the first headset electrical connector and the second headset electrical connector are disposed on the outer side wall of the earbud, and the distance between the locations of the two headset electrical connectors is greater than or equal to a third preset value (for example, may be 1 cm). For example, as shown in FIG. 13, one headset electrical connector is disposed on a location that is on the earbud and that is close to a top, and the other headset electrical connector is disposed on a location that is on the earbud and that is close to a bottom.

In some other embodiments, the wireless headset includes an earbud but does not include a rod body, both the first headset electrical connector and the second headset electrical connector are disposed on the outer side wall of the earbud, and the distance between the locations of the two headset electrical connectors is greater than or equal to the third preset value.

In this case, the distance between the two headset electrical connectors is relatively long, and each of the headset electrical connectors that are dispersedly disposed can have relatively plenty of space inside the headset body to be provided with the anti-interference component, so that the high-frequency and high-voltage interference signal such as the ESD or the surge can be suppressed, and the difficulty in the circuit design can be reduced.

When the headset electrical connector is disposed on the outer side wall of the rod body and faces a side of the earbud (for example, a case shown in FIG. **9B(*b*)**), the headset electrical connector is easily blocked by the rod body and the face of the user, so that the headset body seems to he more simple and beautiful.

The headset box is configured to house the wireless headset. When the wireless headset is housed in the headset box, there may be an interference connection between the headset box and the headset body. The headset box may be provided with a first case electrical connector (namely, a third electrical connector) and a second case electrical connector (namely, a fourth electrical connector) that are respectively connected to two electrodes of the case power module and that respectively correspond to the first headset electrical connector and the second headset electrical connector of the headset body. The first case electrical connector and the second case electrical connector are respectively used in cooperation with the first headset electrical connector and the second headset electrical connector. In some embodiments, magnetic suction components are respectively disposed at corresponding locations of the headset body and the headset box. When the headset body is placed inside the headset box, the headset body may be fastened in the headset box through mutual attraction between the magnetic suction components.

After the first headset electrical connector and the second headset electrical connector described above are respectively in contact with the first case electrical connector and the second case electrical connector in the headset box to establish an electrical connection, the headset box may charge the battery in the headset body through the electrical connection.

For example, in a case, an electrical connection is established after the first headset electrical connector is in contact with the first case electrical connector, and an electrical connection is established after the second headset electrical connector is in contact with the second electrical connector. The headset box may automatically charge, through the electrical connections, the battery in the headset body in which the first headset electrical connector and the second headset electrical connector are located.

In another case, an electrical connection is established after the first headset electrical connector is in contact with the first case electrical connector, and an electrical connection is established after the second headset electrical connector is in contact with the second electrical connector. After the headset box detects, through a sensor such as an optical proximity sensor, an ambient light sensor, or a pressure sensor disposed near the cover, that a cover of the headset box is closed, the headset box may charge, through the electrical connections, the battery in the headset body in which the first headset electrical connector and the second headset electrical connector are located.

In another case, an electrical connection is established after the first headset electrical connector is in contact with the first case electrical connector, and an electrical connection is established after the second headset electrical connector is in contact with the second electrical connector. After the headset box detects an operation performed by the user to indicate charging, the headset box may automatically charge, through the electrical connections, the battery in the headset body in which the first headset electrical connector and the second headset electrical connector are located. For example, the operation performed by the user to indicate charging may be an operation that the user presses/touches a charging control, and the charging control may be disposed on the outer surface of the headset box.

Similar to the first headset electrical connector and the second headset electrical connector, the first case electrical connector and the second case electrical connector may separately have a plurality of different structures and installation manners. In addition, when the first headset electrical connector and the second headset electrical connector on the wireless headset are at different locations on the headset body, the first case electrical connector and the second case electrical connector that are used in cooperation with the first headset electrical connector and the second headset electrical connector are at different locations in the headset box.

Figure 14A:
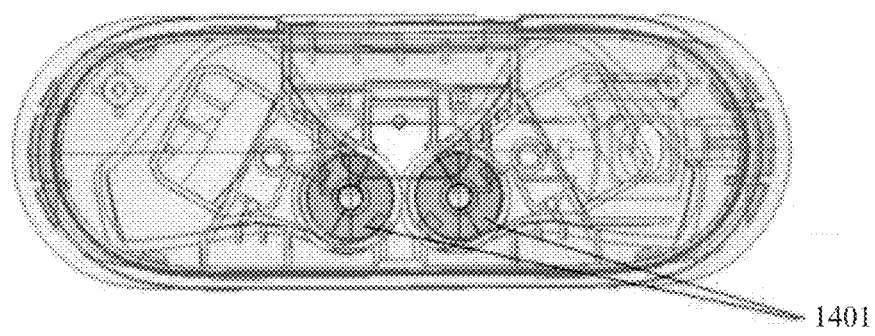
FIG. 14(a) and FIG. 14(b) are a schematic diagram of a location of a case electrical connector according to an embodiment of this application.
Figure 14B:
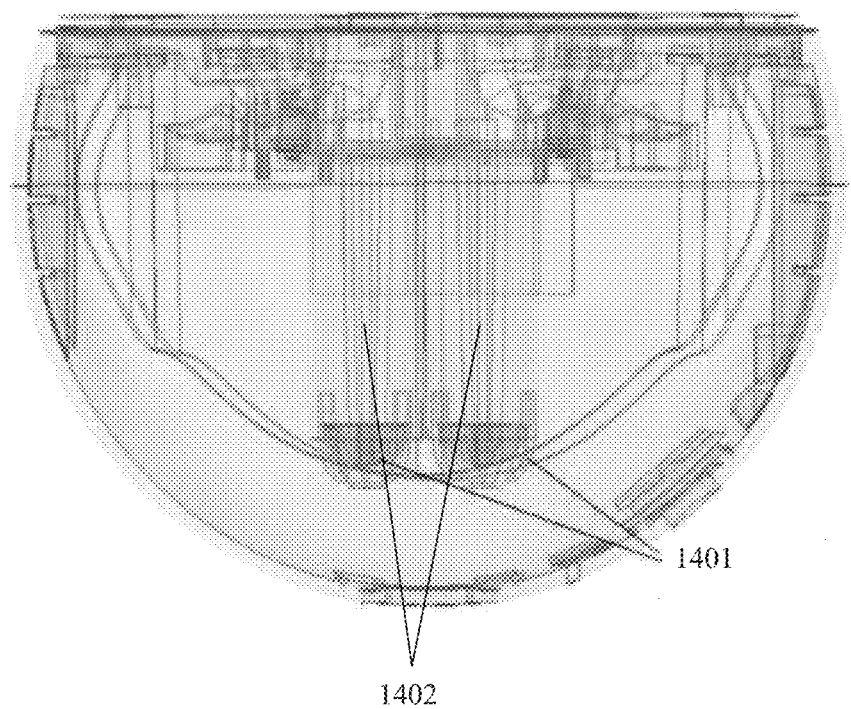
Figure 15A:
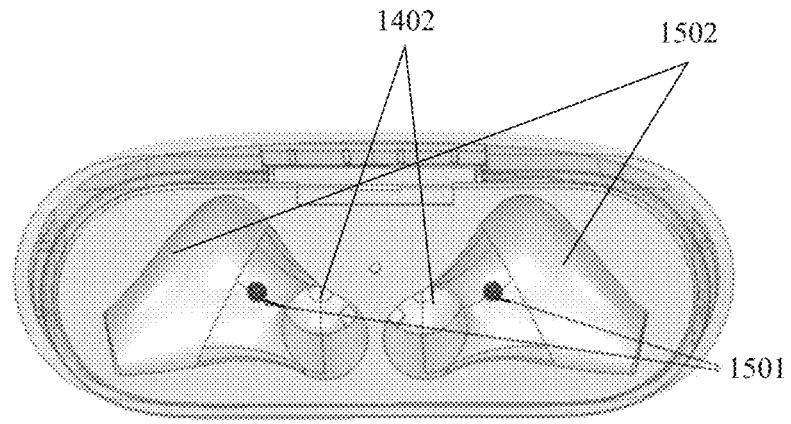
FIG. 15(a) and FIG. 15(b) are a schematic diagram of a location of a case electrical connector according to an embodiment of this application.
Figure 15B:
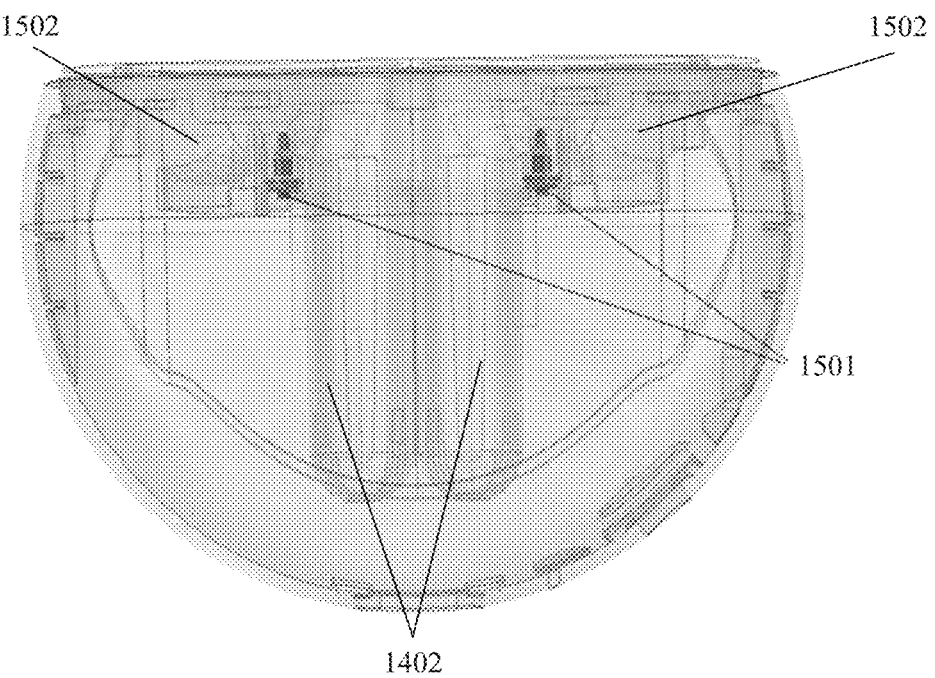

For example, when the first headset electrical connector and the second headset electrical connector are located at locations shown in FIG. 5A, if the wireless headset is vertically housed in the headset box, for a location of a first headset electrical connector 1401 that is used in cooperation with the first headset electrical connector, refer to a top view shown in FIG. 14(*a*) and a side view shown in FIG. 14(*b*). As shown in FIG. 14(*a*) and FIG. 14(*b*), the first case electrical connector 1401 is a bowl-shaped conductive sheet (or a bowl-shaped contact). For a location of a second headset electrical connector 1501 that is used in cooperation with the second headset electrical connector, refer to a top view shown in FIG. 15(*a*) and a side view shown in FIG. 15(*b*). In addition, as shown in FIG. 2(*a*), the wireless headset may be placed inside the headset box. As shown in FIG. 15(*a*) and FIG. 15(*b*), the second case electrical connector 1501 is a spring pin or a pogo pin.

As shown in FIG. 14(*a*), FIG. 14(*b*), FIG. 15(*a*), and FIG. 15(*b*), the headset box may include a. housing and an insert positioned inside the housing. The insert may include two cavities, and sizes and shapes of the cavities are designed to respectively house two headset bodies. The two cavities may communicate with each other or may be separated from each other. Each cavity includes a first sub-cavity 1402 for housing a rod body of a headset body, and a second sub-cavity 1502 for housing an earbud of a headset body. The first case electrical connector 1401 is disposed at the bottom of the first sub-cavity 1402. The first case electrical connector 1401 is used in cooperation with the first headset electrical connector 503. When the headset body is housed in the headset box, the first case electrical connector 1401 and the first headset electrical connector 503 are in contact with each other.

The second case electrical connector 1501 is disposed on a side wall of the second sub-cavity 1502. The second case electrical connector 1501 is used in cooperation with the second headset electrical connector 504. When the headset body is housed in the headset box, the second case electrical connector 1501 and the second headset electrical connector 504 are in contact with each other.

It should be noted that the wireless headset includes two headset bodies, each headset body includes a pair of a first headset electrical connector and a second headset electrical connector, and the wireless headset includes two pairs of a first headset electrical connector and a second headset electrical connector. Correspondingly, the headset box may include two pairs of a first case electrical connector and a second case electrical connector that are used in cooperation with the two pairs of a first headset electrical connector and a second headset electrical connector.

Figure 16:
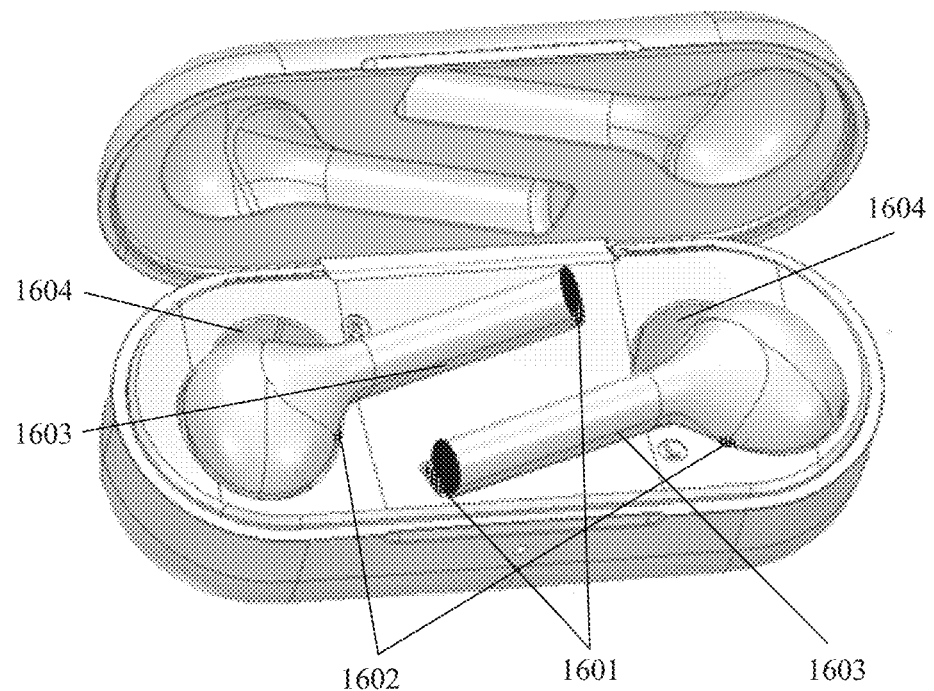
FIG. 16 is a schematic diagram of a location of another case electrical connector according to an embodiment of this application.

For another example, when the first headset electrical connector and the second headset electrical connector are located at locations shown in FIG. 5A, if the wireless headset is housed in the headset box in a horizontal direction (or a lateral direction), for a schematic diagram of locations of a first headset electrical connector 1601 and a second headset electrical connector 1602, refer to FIG. 16.

As shown in FIG. 16, the first case electrical connector 1601 is disposed on a side wall of a first sub-cavity 1603. The first case electrical connector 1601 is used in cooperation with the first headset electrical connector 503. When the headset body is housed in the headset box, the first case electrical connector 1601 and the first headset electrical connector 503 are in contact with each other. The second case electrical connector 1602 is disposed on a side wall of a second sub-cavity 1604. The second case electrical connector 1602 is used in cooperation with the second headset electrical connector 504. When the headset body is housed in the headset box, the second case electrical connector 1602 and the second headset electrical connector 504 are in contact with each other.

Figure 17:
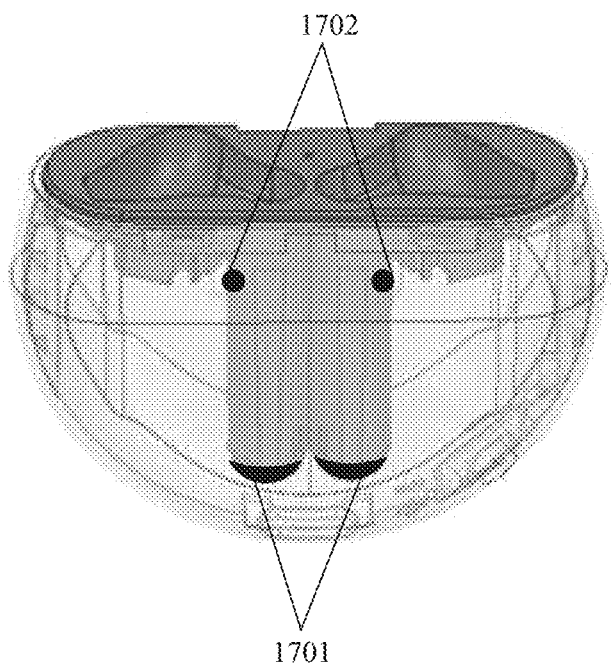
FIG. 17 is a schematic diagram of a location of another case electrical connector according to an embodiment of this application.

For another example, when the first headset electrical connector and the second headset electrical connector on the wireless headset are located at locations shown in FIG. 9B(*a*), if the wireless headset is vertically housed in the headset box, for a location of a first case electrical connector 1701 used in cooperation with the first headset electrical connector and a location of a second case electrical connector 1702 used in cooperation with the second headset electrical connector, refer to a side view shown in FIG. 17.

Similarly to initiating charging of the headset body, the headset box may also stop charging the headset body. For example, after the headset box detects that a case electrical connector is electrically disconnected from a headset electrical connector of any one or two of the headset bodies, the headset box may stop charging the headset body that is electrically disconnected. For another example, after detecting that any one or two of the headset bodies is/are removed from the headset box, the headset box may stop charging the removed headset body. For another example, the headset box stops charging the headset body after detecting an operation performed by the user to indicate to stop charging.

In addition, the headset electrical connector and the case electrical connector are used for an electrical connection, and may be made of various conductive materials, for example, a metal such as copper. A specific material is not limited in this embodiment of this application.

In some embodiments, the headset electrical connector and the case electrical connector may be made of an alloy, to improve antioxidant performance. For example, in some solutions, the headset electrical connector and the case electrical connector may be made of a copper-nickel-silver alloy In some other solutions, the headset electrical connector and the case electrical connector may be made of a phosphorus-bronze alloy In another solution, different alloys may be used.

In some other embodiments, an outer surface of the headset electrical connector and an outer surface of the case electrical connector may be electrically plated with an anti-corrosion metal (for example, gold and silver), to improve anti-corrosion strength.

In addition, there is a liquid-tight seal between the headset electrical connector and the headset body, and between the case electrical connector and the headset box. There is a relatively high waterproof level.

In the descriptions of the embodiments of this application, the specific features, structures, materials, or characteristics may be combined in a proper manner in any one or more of the embodiments or examples.

The foregoing descriptions are merely specific implementations of this application, but are not intended to limit the protection scope of this application. Any variation or replacement readily figured out by a person skilled in the art within the technical scope disclosed in the present invention shall fall within the protection scope of the embodiments of this application. Therefore, the protection scope of the embodiments of this application shall be subject to the protection scope of the claims.

What is claimed is:

1. A wireless headset, comprising:
    a housing comprising a rod body and an earbud connected to a top of the rod body and comprising an outer side wall;
    a power system disposed in a cavity enclosed with the housing and configured to supply power to the wireless headset;
    a first electrical connector located at a bottom of the rod body; and
    a second electrical connector located on the outer side wall,
    wherein a distance between the first electrical connector and the second electrical connector is greater than or equal to a preset value, and
    wherein the first electrical connector and the second electrical connector are disposed on the housing, electrically connected to two electrodes of the power system, and configured to transmit a current from a headset box to the power system to charge the power system when the first electrical connector and the second electrical connector are respectively in contact with a third electrical connector and a fourth electrical connector in the headset box.

2. The wireless headset of claim 1, wherein the second electrical connector is located opposite to the bottom of the rod body.

3. The wireless headset of claim 2, wherein the first electrical connector is of a plastic material, and wherein an outer surface of the first electrical connector is plated with a conductive material.

4. The wireless headset of claim 2, wherein the outer surface of the first electrical connector and an outer surface of the second electrical connector are plated with an anti-corrosion metal.

5. The wireless headset of claim 1, wherein the power system comprises:
    a power management unit comprising a power management integrated circuit (IC), a protection IC, and an electricity meter IC, wherein the first electrical connector and the second electrical connector are respectively electrically connected to two electrodes of an input end of the power management unit; and
    a battery, wherein the two electrodes of an output end of the power management unit are respectively electrically connected to two electrodes of the battery, and wherein the first electrical connector and the second electrical connector are further configured to:
        transmit the current from the headset box to the power management unit; and
        transmit the current to the battery through the power management unit to charge the battery.

6. The wireless headset of claim 2, wherein the power system comprises:
    a power management unit comprising a power management IC, a protection IC, and an electricity meter IC, wherein the first electrical connector and the second electrical connector are respectively electrically connected to two electrodes of an input end of the power management unit; and
    a battery, wherein the two electrodes of an output end of the power management unit are respectively electrically connected to two electrodes of the battery, and wherein the first electrical connector and the second electrical connector are further configured to:
        transmit the current from the headset box to the power management unit; and
        transmit the current to the battery through the power management unit to charge the battery.

7. The wireless headset of claim 5, wherein a first printed circuit board, a second printed circuit board disposed at the bottom of the rod body, and a flexible board that connects the first printed circuit board and the second printed circuit board are accommodated in the cavity, wherein the power management unit is disposed on the first printed circuit board, wherein a negative electrode of the power management unit is grounded, wherein a positive electrode of the battery is electrically connected to a positive electrode of the output end of the power management unit on the first printed circuit board through the flexible board, wherein a negative electrode of the battery is grounded through the flexible board to be electrically connected to the negative electrode of the output end of the power management unit, wherein the first electrical connector is disposed on the second printed circuit board and grounded to be electrically connected to the negative electrode of the input end of the power management unit, and wherein the second electrical connector is disposed on the flexible board and electrically connected to the positive electrode of the input end of the power management unit on the first printed circuit board through the flexible board.

8. The wireless headset of claim 7, wherein the first electrical connector comprises a snap-on component and a soldered component, wherein the second printed circuit board is provided with a snap-on groove and a snap-on groove shaped pad, and wherein the snap-on component and the soldered component respectively cooperate with the snap-on groove and the snap-on groove shaped pad such that the first electrical connector is electrically connected to the second printed circuit board.

9. The wireless headset of claim 7, wherein the second electrical connector is a conductive patch soldered to the flexible board, wherein the outer side wall of the earbud is provided with an opening, wherein a part of the conductive patch is exposed from the opening, wherein an adhesive is attached to a location at which the second electrical connector is in contact with the outer side wall, and used to fasten the second electrical connector to the outer side wall.

10. The wireless headset of claim 8, wherein the second electrical connector is a conductive patch soldered to the flexible board, wherein the outer side wall of the earbud is provided with an opening, wherein a part of the conductive patch is exposed from the opening, and wherein an adhesive is attached to a location at which the second electrical connector is in contact with the outer side wall and used to fasten the second electrical connector to the outer side wall of the earbud.

11. The wireless headset of claim 7, wherein the second electrical connector is electrically connected to a positive electrode of the input end of the power management IC on the first printed circuit board through the flexible board, wherein a positive electrode of the output of the power management IC is electrically connected to a positive electrode of the protection IC and the positive electrode of the battery through the electricity meter IC, wherein a negative electrode of the output of the power management IC and a negative electrode of the protection IC are grounded, and wherein the first electrical connector and the second electrical connector are further configured to:
- transmit the current from the headset box to the power management IC;
- transmit the current to the electricity meter IC through the power management IC; and
- transmit the current to the battery and the protection IC after the current passes through the electricity meter IC to charge the battery and perform circuit protection through the protection IC.

12. The wireless headset of claim 8, wherein the second electrical connector is electrically connected to a positive electrode of the input end of the power management IC on the first printed circuit board through the flexible board, wherein a positive electrode of the output end of the power management IC is electrically connected to a positive electrode of the protection IC and the positive electrode of the battery through the electricity meter IC, wherein a negative electrode of the output of the power management IC and a negative electrode of the protection IC are grounded, and wherein the first electrical connector and the second electrical connector are further configured to:
- transmit the current from the headset box to the power management IC;
- transmit the current to the electricity meter IC through the power management IC; and
- transmit the current to the battery and the protection IC after the current passes through the electricity meter IC to charge the battery and perform circuit protection through the protection IC.

13. The wireless headset of claim 1, wherein the first electrical connector is of a plastic material, and wherein an outer surface of the first electrical connector is plated with a conductive material.

14. The wireless headset of claim 1, wherein the outer surface of the first electrical connector and an outer surface of the second electrical connector are plated with an anti-corrosion metal.

15. The wireless headset of claim 1, wherein the first electrical connector is a pogo pin interface.

16. The wireless headset of claim 1, wherein the first electrical connector and the second electrical connector are pogo pin interfaces.

17. A system comprising:
a wireless headset comprising:
- a housing comprising a rod body and an earbud connected to a top of the rod body and comprising an outer side wall;
- a first electrical connector located at a bottom of the rod body; and
- a second electrical connector located on the outer side wall, wherein the first electrical connector and the second electric connector are disposed on the housing, and wherein a distance between the first electrical connector and the second electrical connector is greater than or equal to a preset value; and a headset box comprising:
- a power system comprising two electrodes; and
- a cavity configured to accommodate the wireless headset,
- wherein an inner wall of the cavity is provided with a third electrical connector and a fourth electrical connector that respectively correspond to the first electrical connector and the second electrical connector, and
- wherein the third electrical connector and the fourth electrical connector are respectively connected to the two electrodes, and configured to transmit a current from the power system to the wireless headset to charge the wireless headset.

18. The system of claim 17, wherein an outer surface of the first electrical connector is plated with a conductive material.

19. The system of claim 17, wherein an outer surface of the second electrical connector is plated with an anti-corrosion metal.

20. The system of claim 17, wherein the first electrical connector and the second electrical connector are pogo pin interfaces.

* * * * *